United States Patent
Murphy

(10) Patent No.: US 9,943,195 B2
(45) Date of Patent: Apr. 17, 2018

(54) METHODS, SYSTEMS, AND APPARATUS FOR MONITORING A DISPENSING STATE OF A DISPENSING SYSTEM

(71) Applicant: GPCP IP Holdings LLC, Atlanta, GA (US)

(72) Inventor: David Warren Murphy, Neenah, WI (US)

(73) Assignee: GPCP IP Holdings LLC, Atlanta, GA (US)

( * ) Notice: Subject to any disclaimer, the term of this patent is extended or adjusted under 35 U.S.C. 154(b) by 183 days.

(21) Appl. No.: 14/750,333

(22) Filed: Jun. 25, 2015

(65) Prior Publication Data
US 2016/0374519 A1    Dec. 29, 2016

(51) Int. Cl.
*A47K 10/42*    (2006.01)
*A47K 5/12*    (2006.01)
*G01R 31/36*    (2006.01)

(52) U.S. Cl.
CPC ............ *A47K 5/1217* (2013.01); *A47K 10/42* (2013.01); *G01R 31/3693* (2013.01)

(58) Field of Classification Search
CPC ... A47K 5/1217; A47K 10/42; G01R 31/3693
USPC ........................................................ 318/139
See application file for complete search history.

(56) References Cited

U.S. PATENT DOCUMENTS

| 4,369,403 A | * | 1/1983 | Lee ......................... H02P 23/26 |
| | | | 318/729 |
| 9,648,991 B2 | * | 5/2017 | Tramontina ......... A47K 5/1211 |
| 2014/0158809 A1 | * | 6/2014 | Borke ................ A47K 10/3687 |
| | | | 242/563 |
| 2015/0313420 A1 | | 11/2015 | Tramontina et al. |
| 2016/0086419 A1 | * | 3/2016 | Geigel .................... G07F 9/026 |
| | | | 700/237 |

FOREIGN PATENT DOCUMENTS

KR    20140094486 A  *  7/2014

* cited by examiner

*Primary Examiner* — Kawing Chan
(74) *Attorney, Agent, or Firm* — Withers & Keys, LLC

(57) ABSTRACT

Methods, apparatus, and systems are described that provide an improved way to monitor the state of a dispensing system and apparatus. The method begins when an activation sensor generates a signal indicating a desired dispense cycle operation in response to detecting user input, such as user hand motion in front of the sensor. The dispenser motor is energized in response to the generated signal, and a battery sensor monitors a status of the battery during a startup phase of the dispenser motor. The monitored status of the battery during the startup phase is indicative of a state (e.g., power state or operational state) of the dispensing system, and a dispenser controller determines if the system can complete the desired dispense cycle operation based upon the monitored status and reacts to control the system accordingly, e.g., aborting a dispense cycle or allowing the dispense cycle to initiate.

33 Claims, 9 Drawing Sheets

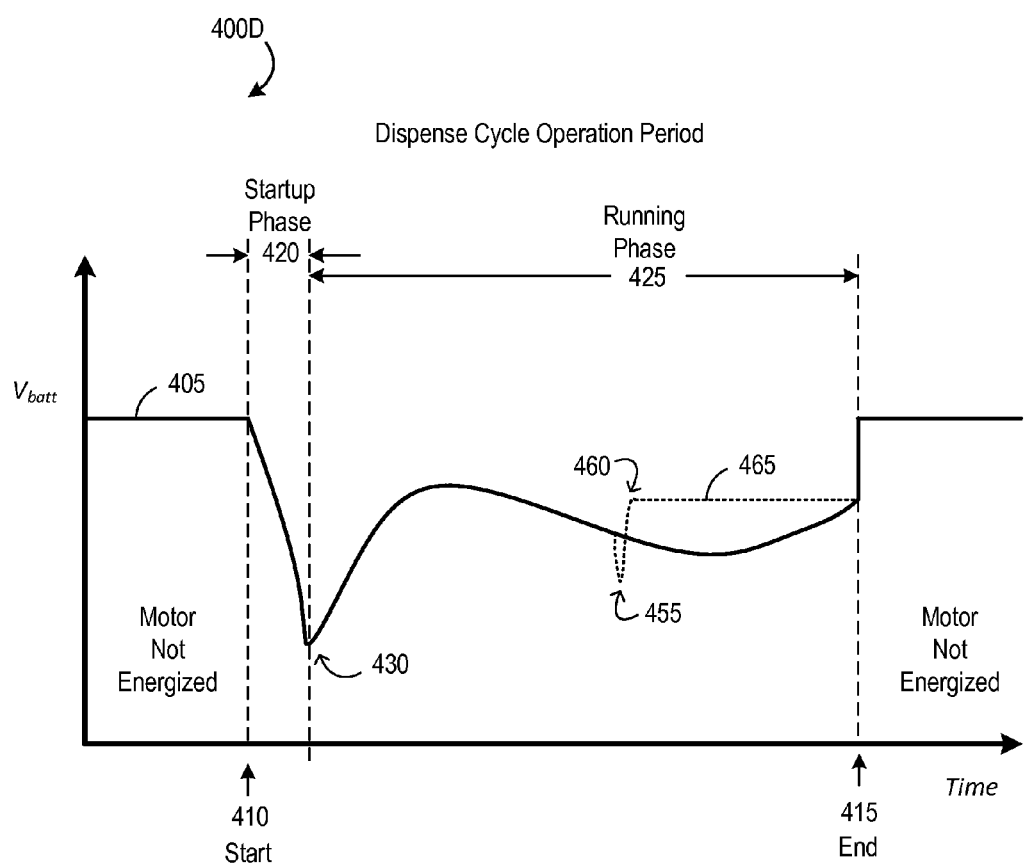

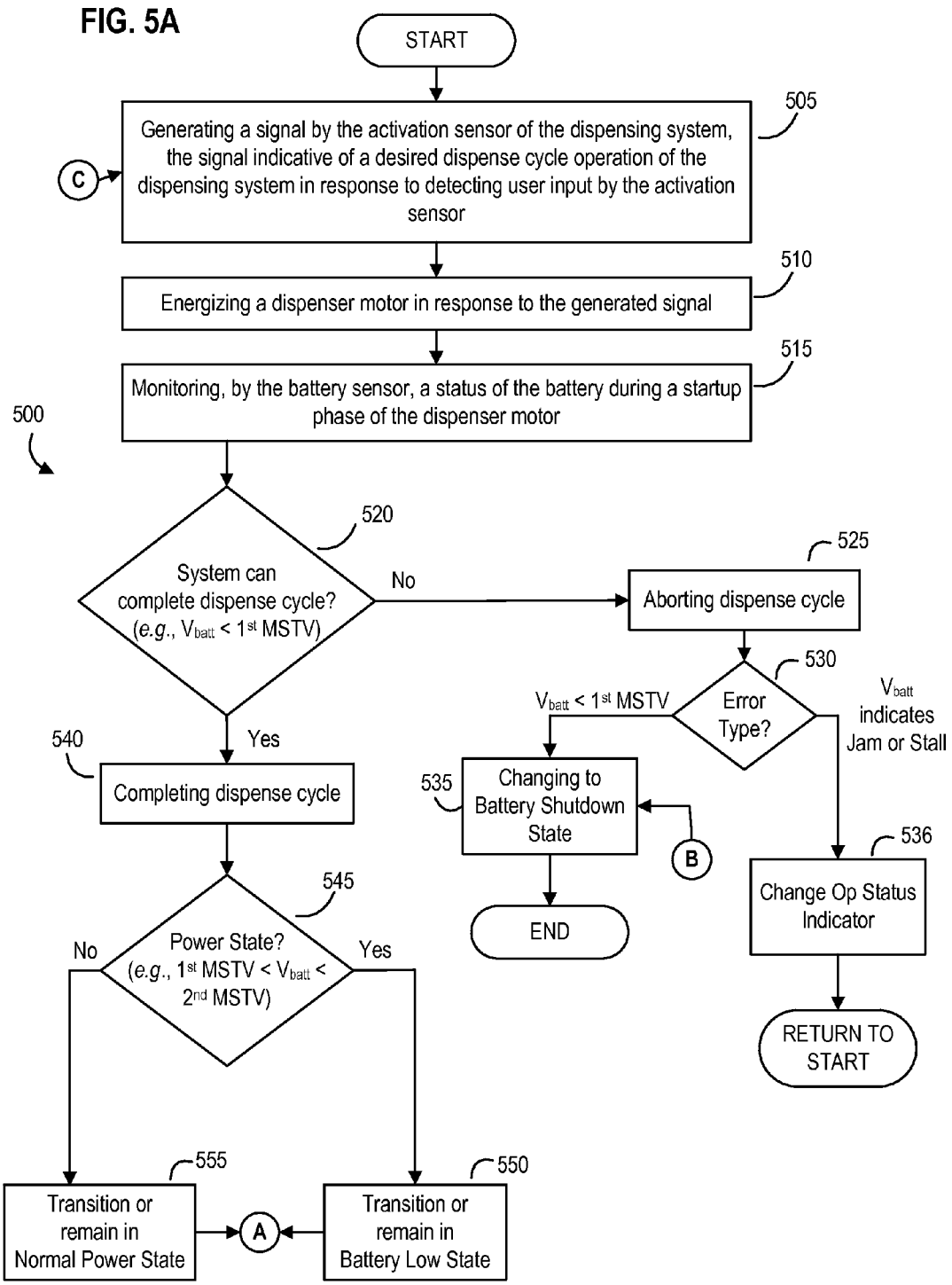

METHODS, SYSTEMS, AND APPARATUS FOR MONITORING A DISPENSING STATE OF A DISPENSING SYSTEM

FIELD OF THE DISCLOSURE

The present disclosure generally relates to the field of automatic dispensers and, more particularly, to improvements and enhancements involving systems, apparatus and methods for improved monitoring of a dispensing state within a dispensing system.

BACKGROUND

Automatic dispensing machines and systems are commonly known to dispense or otherwise provide different types of dispensable consumable products to a user in a controlled manner. For example, dispensing systems are known to dispense and provide paper products, skincare products, cutlery, and tissue products. Such paper products may include, for example, rolled or interfolded hand towels, and the like provided out from part of a towel dispenser. Skincare products used with a pumping dispenser may include, for example, soap, lotion, or sanitizer and may be dispensed or pumped from a repository bag, bottle, or other reservoir and out of a nozzle of the pumping dispenser. Cutlery products that may be dispensed may include, for example, knives, forks, spoons, and the like automatically provided from a cutlery dispenser. Tissue products that may be dispensed may include, for example, toilet tissue or facial tissue. These different types of dispensing systems are known to be used in facilities such as break rooms, office facilities, and restrooms.

Common dispensing systems are typically activated by the user (generally in response to some type of user activity) in order to dispense and controllably provide the consumable product on demand and in an appropriate portion. For example, the user may waive a hand near a motion-activated sensor to activate the system to provide the product in a "demand mode" upon the detected hand waive motion. In another example (conventionally referred to a "hang mode"), a portion of the product may already be exposed and available to the user. The user may actively remove the already available portion (e.g., a part of a rolled or interfolded hand towel). However, the user activity of taking the available portion or tearing away the available portion may be sensed or detected as user input by the system via another type of activation sensor (more specifically in some examples referred to as a tear sensor). The tear sensor senses the continued presence or absence of the available portion. The tear sensor may operate to sense such a presence or absence of the available portion by, for example, detecting motion of the available portion as it is being pulled by the user. In another example, the tear sensor may operate to sense such a presence or absence of the available portion by detecting light that may otherwise be blocked when the available portion remains in the exposed and available position. When removed, the material of the available portion no longer blocks the light, such that detection of the light indicates a user has removed the available portion. Thus, when such a tear sensor no longer senses the continued presence of the available portion of the product, the tear sensor may generate a signal, which activates the system to provide the next available portion ready for the same or another user. While such examples allow the user to activate the sensor without actually touching the sensor, activation may also be accomplished in further examples by depressing a button or pulling a lever on a dispensing system as a way to request dispenser operation.

During operation, the dispenser typically operates through a dispense cycle to provide an appropriate portion of the consumable product. During this operation, common dispensers typically engage a motor to actuate and otherwise facilitate moving the dispensable consumable product from within the dispenser to a point where the user may have access to the product (e.g., out the bottom of the dispenser, out an exit port of the dispenser, etc.). In doing so, the dispenser relies upon an energized motor to turn or otherwise effect the requisite movement of part of the motor relative to other articulating structure that helps provide the product to the user requesting it. For example, the dispenser motor may turn or otherwise effect or cause movement of a spindle having a roll of perforated hand towels. In another example where the product is a towel that is not mounted on a spindle nor perforated, the towel roll may be supported about its ends on support stubs, sometimes referred to as roll holders. Below the towel roll, a drive roller and a pinch roller are positioned in close proximity to each other, creating a "nip" there between. A tail of the towel roll may be threaded through the nip. To dispense the towel, the dispenser motor may rotate the drive roller, pulling the towel through the nip via friction. The towel is then separated from the roll using a tear bar.

While some dispensing systems may be powered via a hardwired connection to a conventional AC outlet, others may be battery-powered. A battery-powered dispensing system allows for easy placement and/or movement of the dispensing system within a facility without regard to the proximity of AC power outlets or other hardwired energy sources. However, reliance upon a battery within a dispensing system can become problematic at times as the battery is repeatedly used and the available power of the battery decreases.

Common battery-powered dispensing systems are known to check the status of the battery when the dispensing motor is not running. However, such a monitoring method may lead to inaccurate results in predicting an adequate amount of power available to complete a dispense cycle operation. For example, a problem using known dispenser battery monitoring techniques is that they may not catch situations that may result in a stall or partial dispense cycle situation. In a stall or partial dispense cycle, the dispensing motor may start moving (e.g., rotating, pumping, actuating, etc.) so as to start to provide the dispensable consumable product. However, the dispense motor may be unable to complete the dispense cycle because, for example, the battery is incapable of supplying enough energy during the dispense cycle to complete the cycle despite being able to supply energy to start to provide the dispensable product. In such a situation, the dispensing apparatus may become jammed with a partially ejected or otherwise provided product and the user being left frustrated and dissatisfied. For situations where the dispensed product may be in a form that may be pumped out (such as liquid soap), the dispensing apparatus may not complete the dispense cycle such that the pump dispenser is left stuck in an open position, which may undesirably drain the rest of the dispensable product out and create further user frustration, dissatisfaction, and a janitorial mess to clean up.

To help address these types of problems, an improved way to predict successful dispensing operations is needed when the dispenser is battery powered. Thus, there remains a need for an improved method, system, and apparatus for monitoring a dispensing status of a battery-powered dispenser.

SUMMARY

In the following description, certain aspects and embodiments will become evident. It should be understood that the aspects and embodiments, in their broadest sense, could be practiced without having one or more features of these aspects and embodiments. It should be understood that these aspects and embodiments are merely exemplary.

One aspect of the disclosure relates to an improved method for monitoring a dispensing state of a dispensing system, where the dispensing system includes at least an activation sensor, a controller, a dispenser motor, a battery, and a battery sensor. In this aspect, the method generally begins by generating a signal by the activation sensor of the dispensing system, where the signal indicates a desired dispense cycle operation of the dispensing system in response to detecting user input by the activation sensor. The method proceeds by energizing a dispenser motor in response to the generated signal, and then using the battery sensor to monitor, a status of the battery (e.g., a battery voltage or a battery current) during a startup phase of the dispenser motor. The method continues with the controller determining if the system can complete the desired dispense cycle operation based upon the monitored status of the battery indicative of the dispensing state of the dispensing system. Such a dispensing state may include a power state (e.g., the state of the battery) or an operational state of other parts of the system (e.g., a jammed state of the dispenser). The method may also include further actions taken in response to the dispensing state, such as completing the dispense cycle if the power state is sufficient to complete a dispense operation cycle or aborting the dispense cycle operation before the dispensing system enters an undesirable state (e.g., being jammed or stalled and requiring user intervention).

In another aspect of the disclosure, an improved dispensing system is described. In this aspect, the system generally comprises a battery, a dispenser motor, a battery sensor, and control circuitry. The battery has an output for providing power for the system. The dispenser motor is configured to be selectively coupled to the battery (e.g., via switchable or otherwise controllable connection circuitry that electrically provides power that can energize the dispenser motor). As such, the dispenser motor is responsive, when energized, to facilitate dispensing a consumable product in a desired dispense cycle operation. The battery sensor has an input coupled to the output of the battery and operates to monitor a status of the battery (e.g., a battery voltage, a battery current) during a startup phase of the energized dispenser motor. The battery sensor then provides the monitored status as a battery sensor output signal. The control circuitry further comprises a controller (e.g., a microcontroller or a microprocessor) that is specially adapted and operative to perform specific functions as part of monitoring a dispensing state of the system. More specifically, the controller in this aspect is operative to selectively couple the dispenser motor and the battery to energize the dispenser motor; receive the battery sensor output signal associated with the monitored status of the battery from the battery sensor during the startup phase of the dispenser motor; and determine if the system can complete the desired dispense cycle operation of the dispensing system based upon the monitored status of the battery during the startup phase of the dispenser motor indicative of a dispensing state of the system.

In yet another aspect of the disclosure, another improved dispensing apparatus is described. In this aspect, this apparatus generally comprises a dispenser housing, a battery, a dispenser motor, a battery sensor, at least one status indicator, an activation sensor, and control circuitry. The dispenser housing of the apparatus contains a dispensable consumable product, such as a paper towel product, a soap product, or a cutlery product. The apparatus' battery is disposed within the dispenser housing and has at least one output terminal for providing power for the apparatus. The apparatus' dispenser motor is disposed within the dispenser housing and selectively connected to the at least one output terminal of the battery. The dispenser motor is responsive, when energized by a power connection to the battery through the output terminal, to facilitate dispensing the dispensable consumable product. The dispenser motor has a startup phase when initially energized and a running phase while the dispenser motor remains energized after the startup phase. The battery sensor of the apparatus is disposed within the dispenser housing and has an input connected to the at least one output terminal of the battery. The battery sensor measures a battery characteristic on the at least one output terminal of the battery (e.g., a battery voltage across the battery's output terminal or a battery current provided through the output terminal) before the dispenser motor substantially moves during a startup phase. As such, the battery sensor provides the measured battery characteristic as a battery sensor output signal. The apparatus' status indicator is disposed as part of the dispenser housing and provides user feedback related to a dispensing status of the system. And the apparatus' activation sensor generates a signal indicative of a desired dispense cycle operation in response to detecting user activity.

The control circuitry of the apparatus further comprises at least a controller, a memory coupled to the controller, and an interface circuit coupled to the controller. The interface circuit is also coupled to the activation sensor, the dispenser motor, the battery sensor, and the status indicator. The controller is programmatically adapted by executable code maintained on the memory to be operative to perform specific operational functions as part of an improved way to monitor a dispensing status for the apparatus. In more detail, the controller as specially adapted via the code is operative to detect the signal from the activation sensor through the interface circuit; selectively activate the power connection between the dispenser motor and the at least one output terminal of the battery in response to the detected signal from the activation sensor; during the startup phase of the dispenser motor, receive the battery sensor output signal through the interface circuit; deactivate the power connection between the dispenser motor and the at least one terminal of the battery to abort the desired dispense cycle operation and cause the status indicator to reflect a battery shutdown state of the improved dispensing apparatus when the level of the measured battery characteristic from the battery sensor during the startup phase differs from a first motor startup boundary; and continue to activate the power connection while the dispenser motor completes the desired dispense cycle operation and cause the status indicator to reflect a battery low power state of the improved dispensing apparatus when the level of the measured battery characteristic from the battery sensor during the startup phase differs from a second motor startup boundary.

Each of these aspects respectively effect improvements to the technology of monitoring a status of an automated dispensing systems where a user may be provided with a dispensable consumable product, such as a paper towel, soap, or cutlery. Additional advantages of this and other aspects of the disclosed embodiments and examples will be set forth in part in the description which follows, and in part will be obvious from the description, or may be learned by practice of the invention. It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments according to one or more principles of the invention and together with the description, serve to explain one or more principles of the invention. In the drawings.

FIG. 4D is a graph illustrating yet another exemplary voltage characteristic of a battery over time during an exemplary dispense cycle operation involving detection of an exemplary inoperable state in accordance with an embodiment of the invention; and FIGS. 5A and 5B, collectively FIG. 5, are flow diagrams illustrating an example of an improved method for monitoring a power state of a dispensing system in accordance with an embodiment of the invention.

DESCRIPTION OF THE EMBODIMENTS

Figure 1:
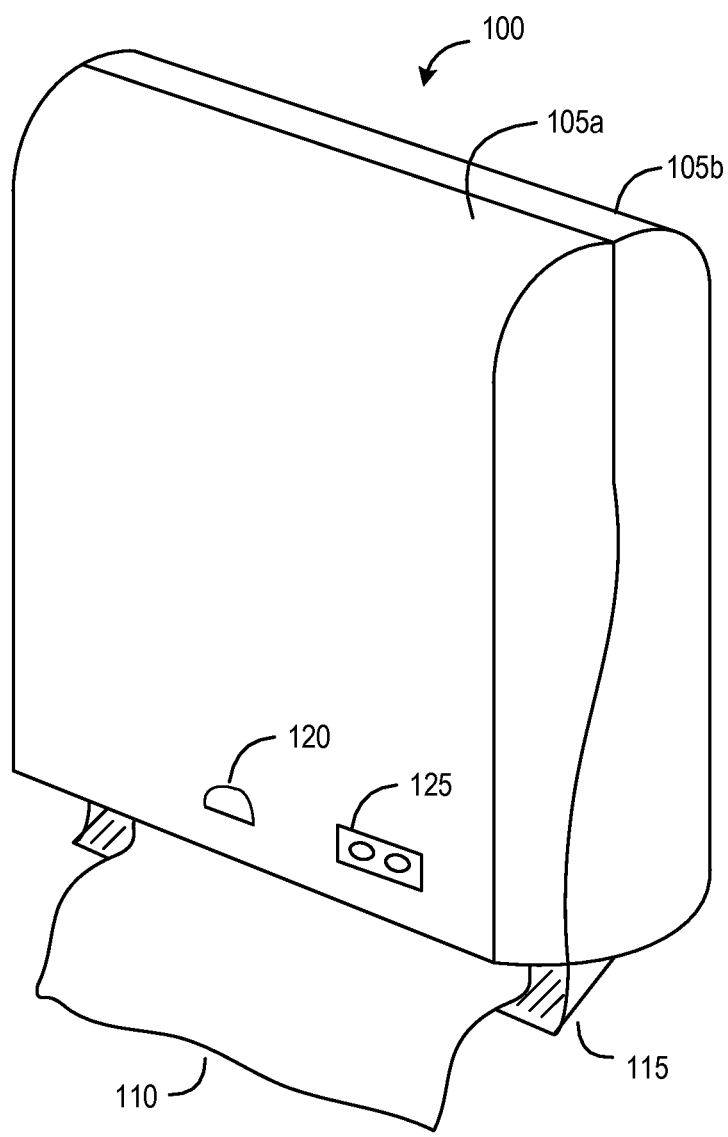
FIG. 1 is a diagram illustrating an external perspective view of an exemplary improved dispensing apparatus in accordance with an embodiment of the invention.

Reference will now be made in detail to various exemplary embodiments. Wherever possible, the same reference numbers are used in the drawings and the description to refer to the same or like parts.

In general, the following describes various embodiments of exemplary dispensers and how they may operate in an improved way to better monitor a dispenser's battery, determine a dispensing state of the dispenser, and react with appropriate operations of the dispenser (such as not allowing a dispense operation to proceed to avoid jamming the dispenser) given the determined state. As explained in more detailed embodiments below, the determined state of the dispenser may include, in some embodiments, a power state (e.g., a power state relative to the system or, more specifically, the system's battery) or an operational state (e.g., a jammed, stalled, inoperable, or normal operational state of the system or, more specifically, one or more of the dispensing mechanisms that make up the dispensing system beyond just the system's battery). Thus, such an enhanced way to monitor a dispensing system may advantageously provide improved and more accurate insight as to a current status and operational capabilities of a dispensing system.

In general, embodiments may determine the battery state while the motor is energized instead of idle, which enables determining the battery state more accurately. In some embodiments, the battery state may be determined during a startup phase of the dispense cycle, meaning when the motor is energized but not rotating, while in other embodiments the battery state may be determined during a running phase of the dispense cycle, meaning when the motor is rotating. In still other embodiments, the battery state may be determined during a combination of any portion of the startup and running phases.

If the nature of an exemplary dispense operation is such that the battery may be exposed to a variable load during the running phase, determining the battery state during the startup phase may improve accuracy. An example is a soap dispenser having a motor that actuates a pump, exposing the battery to a variable load as the pump cycles through the various phases of its stroke.

If the nature of an exemplary dispense operation is such that the battery may be exposed to a relatively constant load during the running phase, an embodiment may more accurately determine the battery state during the startup phase, the running phase, or some combination thereof. An example is a towel dispenser having a motor that drives a drive roller at a relatively constant speed.

In some embodiments, determining the battery state during the startup phase may facilitate aborting the dispense cycle before the motor significantly actuates if the battery state indicates the dispense cycle cannot be completed. For example, in a soap dispenser, if the battery state suggests the battery life is insufficient to complete the dispense cycle, the cycle may be aborted before the motor begins actuating the pump, which helps avoid a battery failure with the pump in the open condition. As another example, in a towel dispenser, if the battery state suggests the dispenser is experiencing a jammed or stalled condition, the cycle may be aborted before the motor begins to significantly or appreciably drive the drive roller to avoid exacerbating the jammed or stalled condition.

Those skilled in the art will appreciate that each embodiment described herein effects improvements to particular technologies, such as operations of a battery-powered dispenser. Each embodiment describes a specific technological application of an improved way to monitor a dispensing system's power state where the specific technological application improves or otherwise enhances the operation of battery-powered dispensing apparatus and systems as explained and supported by the disclosure that follows.

Figure 2:
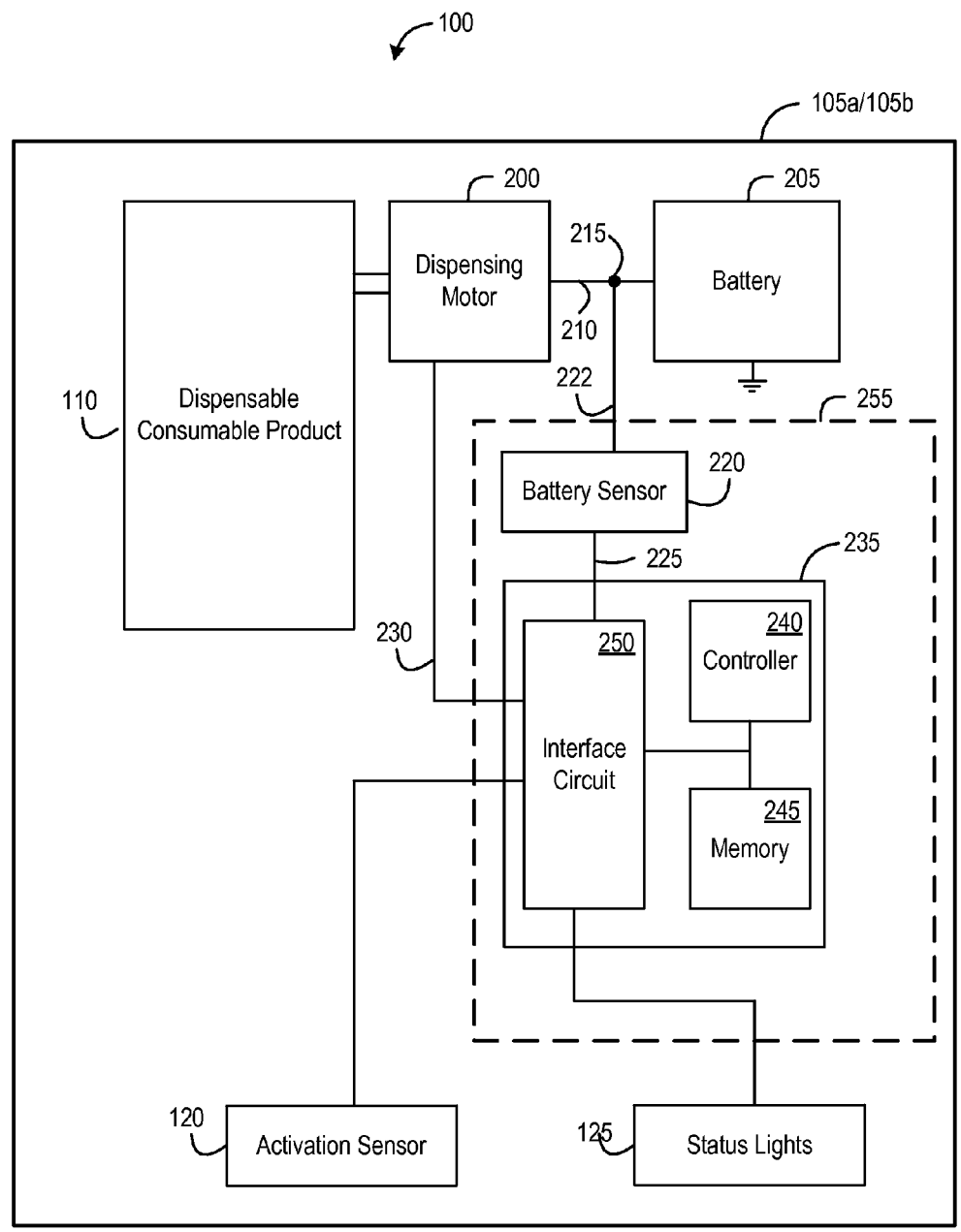
FIG. 2 is a block diagram of an exemplary dispensing system in accordance with an embodiment of the invention.

In general, FIGS. 1 and 2 are diagrams showing an exemplary dispensing apparatus and system. FIGS. 3 and 4A-D illustrate different exemplary power states as well as exemplary battery voltage profiles over time as an exemplary dispensing system or apparatus is operated in accordance with different embodiments. FIGS. 5A and 5B provide exemplary flow diagrams illustrating steps involved in operations of such an exemplary dispensing system or apparatus where power state monitoring has been enhanced to improved dispensing operations.

In more detail, FIG. 1 is a diagram illustrating an external perspective view of an exemplary improved dispensing apparatus in accordance with an embodiment of the invention. Referring now to FIG. 1, an external view of an exemplary dispenser apparatus 100 that dispenses paper towel products 110 through a feed opening 115 at the bottom is shown in a closed and operative configuration. Exemplary dispenser apparatus 100 is typically mounted on a wall with a rear housing portion 105b attached to the wall while a front housing portion 105a may be opened via hinges (not shown) and/or other opening structure (e.g., clips, snaps, closure devices, and the like). As such, exemplary dispenser apparatus 100 may be opened to replace the consumable dispensable product, such as the paper towels 110, or perform maintenance on the apparatus 100, such as replacing one or more batteries (not shown) that power the apparatus 100. After opening and performing such maintenance, the dispenser apparatus 100 may be closed and returned to an operative configuration when the front housing portion 105a is rotated down by a user or maintenance personnel to meet and close with the rear housing portion 105b along their respective periphery.

In one embodiment, the front housing portion 105a may be translucent so as to provide an exterior view that shows a status of the paper towels 110 left within an internal temporary storage repository for the towels 110 as well as other internal features with the housing of the apparatus 100. While the embodiment shown in FIG. 1 illustrates an exemplary dispenser housing having at least two parts 105a, 105b, other embodiments may employ different configurations for the dispenser housing so as to provide different types of openings that better allow the dispensed product to exit the apparatus 100 as well as provide different openings or ways to access the interior of the dispenser housing for maintenance and replacement of the product being dispensed.

In general, the dispenser apparatus 100 may dispense or controllably provide a dispensable consumable product (such as paper towel product 110) through feed opening 115 after dispenser 100 detects movement within a relative proximate range of activation sensor 120. Exemplary activation sensor 120 may be disposed on part of the dispenser housing 105a such that at least a portion of the activation sensor 120 is exposed to outside the dispenser housing 105a, such as on the front exterior surface of front housing portion 105a. For example, as shown in FIG. 1, when a user moves their hand near the activation sensor 120, the activation sensor 120 may generate a signal indicative of a desired dispense cycle operation in response to detecting user input (such as the movement of the user's hand). As shown in FIG. 1, exemplary activation sensor 120 may be implemented with a type of motion detector. However, other embodiments may deploy different types of activation sensors (such as a button, a microphone, or other input device, or other types of internal or external sensors, such as a heat sensor or location sensor) that receive input from a user in one or more of a variety of forms (such as a depression of the button, receipt of a sound by the microphone, detection of removal of an available towel).

For example, in a further embodiment, the activation sensor 120 may be implemented as a tear sensor. As noted above, an exemplary tear sensor is a type of activation sensor 120 useful when the dispenser 100 operates to provide the next available portion of the consumable product 110 (e.g., a towel) in "hang mode." As such, the next available portion remains exposed and available to be torn by a user (which is a type of input from the user), after which the dispenser 100 operates to dispense another available portion of the product. In such an embodiment, the exemplary tear sensor implementing activation sensor 120 operates to detect or sense the continued presence or absence of the available portion 110. For example, the tear sensor 120 may be disposed and focused on the available portion 110 so that it is able to sense the presence or absence of the available portion by detecting movement of the available portion 110 as it is being pulled by the user. In another example, the tear sensor 120 may be implemented with a light source on one side of the available portion 110 and a light detector on the opposing side of the available portion 110. The tear sensor 120 may operate to sense the presence or absence of the available portion 110 by generating light by the light source and detecting light with the light detector. When the available portion 110 remains in the exposed and available position, the generated light may not be detected due to the intervening material of the available portion 110 that effectively blocks the generated light from being detected. When the available portion 110 is removed, the material of the available portion 110 no longer blocks the light, such that detection of light indicates user input that reflects that the user has removed the available portion 110. In this situation, the tear sensor 120 generates a signal to activate a dispense cycle of the dispenser 100.

Additionally, one or more exemplary status indicators 125 may be disposed on the dispenser housing 105a. Examples of such status indicators 125 may include one or more lights, such as multi-mode LEDs, where different colors and/or combinations of lights may indicate a different status related to operation of the dispenser apparatus 100. In more detail, an embodiment of the status light or indicators 125 are disposed such that they are visible from the exterior of the dispenser housing 105a, and provide a type of operational status or maintenance indication relative to the dispenser apparatus 100 and/or its contents (e.g., a power state of its replaceable battery, a present operational status of the dispenser, and the like). For example, the indicators 125 may indicate a present power level status for the dispenser 100, such as a battery shutdown power state of the onboard battery, as will be explained in more detail below. Another example may have the indicators 125 indicating a type of operational state, such as a normal operating state, a jammed state, a stalled state, or an inoperable state where the dispensing system may be broken.

Further examples of status indicators 125 may include a speaker that provides an audible status indication or may include a graphical screen or other type of visual indicator that provides a more detailed status of the dispenser.

Those skilled in the art will appreciate that other types of dispenser apparatus 100 may dispense other types of consumable and dispensable products, such as sanitizer, soap or cutlery, and that principles of the improvements in the described embodiments may also apply to other types of battery-powered dispensing machines or systems.

FIG. 2 illustrates a block diagram of various components within and part of an exemplary dispensing system in accordance with an embodiment of the invention. Referring now to FIG. 2, dispenser apparatus 100 is generally shown with a housing 105a/105b, a repository of dispensable consumable product 110, a dispensing motor 200, a battery 205, a battery sensor 220, activation sensor 120, status indicators 125, and control circuitry 235. In general, the exemplary battery 205 provides electrical power on an output terminal 215 to the different active electrical components within the dispenser apparatus 100 that require power to operate, such as the dispensing motor 200, the battery sensor 220 (if implemented with active circuitry), activation sensor 120, status indicators 125, and control circuitry 235. In general, the control circuitry 235 essentially operates to receive input from activation sensor 120, selectively control when to energize or power the dispensing motor 200, receive an output from battery sensor 220, determine the power state of the apparatus 100, and when and how to toggle or activate status indicators 125 to reflect such a power state in addition to allowing the dispense cycle operation to commence, continue, or stop.

In more detail, as shown in the embodiment of FIG. 2, the battery 205 disposed within the dispenser housing 100 has at least one output terminal 215 for providing power for the dispensing apparatus. While not shown in FIG. 2, those skilled in the art will appreciate that the output terminal 215 typically exposes a voltage potential across the battery 205 relative to a common ground and provides power for the electronic components within housing 100. In more detail, the output terminal 215 is where current may flow from the battery 205 so that power is supplied to the other electronic components in the apparatus 100. As such, while FIG. 2 illustrates a particular power connection 210 between battery 205 and dispensing motor 200, those skilled in the art will appreciate that other power connections to other powered components within housing 100 exist but are not shown for sake of clarity. For example, the output terminal 215 of battery 205 may be connected to a power bus (not shown) within apparatus 100, where the power bus helps to efficiently and effectively distribute electrical power to other components, such as control circuitry 235 and activation sensor 120.

In some embodiments, the battery 205 may be implemented with one or more replaceable batteries. Each of such batteries may have one or more cells and may be implemented with rechargeable or non-rechargeable types of batteries (e.g., alkaline, lithium-ion, nickel-cadmium, nickel metal hydride, etc.).

The dispensing motor 200 is disposed within the dispenser apparatus 100 and selectively connected to the at least one output terminal 215 of the battery 205. In one embodiment, power connection 210 may directly couple battery terminal 215 to a power input of the motor 200. As such, the motor 200 is then operated, controlled, and selectively energized with a control input connection 230 to the motor 200. In other words, power connection 210 may make electrical power available to motor 200, but energizing the motor 200 to move and actuate may be accomplished with the separate control input connection 230. As such, an internal switch (not shown) or other selective power control electric circuitry may be deployed within motor 200 that allows a control signal (e.g., a signal applied to input connection 230) to couple the motor 200 to the available power provided from the battery 205 on terminal 215 and through power connection 210. However, in another embodiment, motor 200 may be selectively coupled to battery 205 in order to be energized and begin moving via an external switch (not shown) connected in line with or as part of power connection 210. Such an external switch may be controlled with a similar control input connection 230, which actuates the external switch and causes motor 200 to be energized or de-energized, accordingly.

The dispensing motor 200 shown in FIG. 2 may be mechanically coupled or otherwise operative to move or cause movement of dispensable consumable product 100 from within the apparatus 100 and out of the feed opening 115 once the motor 200 is energized. In example of FIG. 2, the repository of dispensable consumable product 110 may take the form of a roll of paper towels that may be incrementally dispensed via actuations by dispensing motor 200. In an embodiment, dispensing motor 200 may drive a drive roller and a nip roller. The roll of papers towels may be mounted on two roll holders (i.e., spindle stubs) and may be free to rotate with reference to the roll holders. A free end of the towel roll may be positioned between the drive roller and nip roller. When the drive roller is actuated or driven by the motor 200, the towel may be pulled through the rollers under friction.

In another embodiment, the roll of paper towels may be affixed to a spindle that may be actuated. In this embodiment, dispensing motor 200 may cause the spindle to turn and, as a result, provide a paper towel 110 out the apparatus 100. In more detail, a certain amount of rotation of the dispensing motor 200 may cause a certain amount of rotation of the paper towel roll 110 wound onto the spindle, such that only a desired amount of the paper towel 110 is dispensed upon each dispense cycle operation of the dispensing motor 200. In other embodiments, dispensing motor 200 may be implemented as a pump or other type of actuating device that moves to facilitate providing the dispensable consumable product 110 (e.g., liquids, soap, sanitizer, or cutlery) to a requesting user. Those skilled in the art will appreciate that different types of motors based on other actuating electromechanical devices (such as a solenoid, muscle wire, and the like) may be suitable as a dispensing motor 200, depending on the deployed embodiment and type of product to be dispensed, but that such a motor 200 presents a load on battery 205 as the motor 200 is energized and operates during a dispense cycle operation that includes a startup phase and a running phase. In a general embodiment, the startup phase relates to initial operations prior to the motor 200 moving and engaging the load fully, whereas the running phase relates to operations once the motor 200 has fully engaged the load and begins to actuate or otherwise move as it provides force that causes dispensing action to occur. Further details on these phases are explained below with reference to FIGS. 4A and 4B.

FIG. 2 shows exemplary battery sensor 220 disposed within the dispenser apparatus 100. In the illustrated embodiment, the battery sensor 220 includes an input 222, which is connected to the battery 205 (more specifically, the output terminal 215 of battery 205). Generally, the exemplary battery sensor 220 monitors a status of the battery 205 during at least a startup phase of the energized dispenser motor 200 (and in some embodiments during the running phase) and provides the monitored status as a battery sensor output signal on an output 225 of the battery sensor 220. Such a monitored status, as reflected by the battery sensor output signal 225, may be used to better determine the dispenser's operational state. In a more detailed embodiment, battery sensor 220 may measure a battery characteristic relative to the at least one output terminal 215 of the battery 205 during at least a startup phase of the motor 200. In this embodiment, the battery sensor 220 provides the measured battery characteristic as the battery sensor output signal on the output 225 of sensor 220. Based upon the output 225 of sensor 220, the state or status of the battery 205 may be determined relative, which is associated with an operational state of the dispenser as a whole.

Battery sensor 220 may be implemented to monitor a power state of the battery 205 by measuring one or more different battery characteristics. For example, in one embodiment, battery sensor 220 may be implemented as a voltage monitor circuit that measures a voltage characteristic of the battery, such as the voltage potential across the output terminal 215 of battery 205 (also referred to as $V_{batt}$) at a specific point in time. In another embodiment, battery sensor 200 may be implemented as a current monitor circuit that measures a current characteristic of the battery, such as the current being provided out of the output terminal 215 of battery 205 to dispensing motor 200 at a specific point in time. As such, the battery sensor 220 is operative to monitor a status condition by, for example, measuring samples of a battery characteristic while the dispensing motor 200 provides a load against the battery 205 and is initially energized during a startup phase, as well as during a running phase in some embodiments. As explained in more detail below in FIGS. 4A-4D, the load may vary during the startup and running phases of the dispense cycle operation during various operational states of the system.

The output 225 of battery sensor 220, as shown in the embodiment of FIG. 2, is connected to exemplary control circuitry 235 within dispenser apparatus 100. As noted above, the control circuitry 235 generally receives the output from the battery sensor 220 when monitoring a status of the battery 205 in an embodiment, and may interact with other components within the dispenser apparatus 100 (such as the activation sensor 120, status indicators 125, and control signals actuating the dispenser motor 200) as part of monitoring. In one embodiment, such as that illustrated in FIG. 2, control circuitry 235 may comprise a controller 240, a memory 245, and an interface circuit 250. As shown in the embodiment of FIG. 2, the controller 240 is operatively coupled to both the memory 245 and interface circuit 250 so as to access and write data to memory 245, run non-transient executable program code that may be stored in readable memory 245, and receive and send signals via the interface circuit 250.

Those skilled in the art will appreciate that an embodiment of controller 240 may be implemented with a processing unit, such as a low-power consumption microprocessor, that generally performs computations on data and executes operational and non-transient application program code and other non-transient program modules or sections thereof within control circuitry 235. In another embodiment, controller 240 may be a central processing unit of an application specific microcontroller (or a more integrated microprocessor) that also implements the rest of control circuitry 235, including memory 245 and interface circuit 250. Such an embodiment that implements controller 240 and rest of control circuitry 235 with the same microcontroller may allow for a more efficient implementation compared to a separate microprocessor-based implementation of controller 240, memory 245, and interface circuit 250. As such, those skilled in the art will appreciate that slower and less complex microcontrollers or discrete circuitry may be used to implement controller 240 as well as faster, more complex, and more sophisticated microprocessors.

An embodiment may implement memory 245 as volatile (e.g., RAM) and/or non-volatile memory (e.g., ROM). As noted in the embodiment described above, memory 245 may operate as storage for data and/or non-transient program code. For example, in an embodiment where controller 240 is implemented with discrete circuitry or a hardwired circuit (e.g., field programmable gate array (FPGA) or other hardwired logic circuits), memory 245 may not need to store program code as the functionality and decision-making logic is hardwired within the discrete circuitry or programmed array. As such, memory 245 in this example may be used for storing data, such as measured samples of a voltage or other battery characteristics or boundary values used during operation of the controller 240 to determine the state of the dispensing system. However, in another embodiment where controller 240 may be implemented with a programmable microcontroller or microprocessor, specific non-transient program code may be stored in memory 245 in addition to other data (such as measurements from the battery sensor 205). In a more detailed embodiment, memory 245 may maintain exemplary non-transient program code that operates to implement one or more of the described methods as a state machine type of non-transient code module that monitors the state of the battery and transitions between dispensing states (such as different power states or different operational states) accordingly. Further details regarding the particular steps implemented by such an exemplary code module are described below with respect to FIGS. 5A and 5B.

Referring back to the embodiment of FIG. 2, interface circuit 250 is coupled to the controller 240, as well as circuitry outside the control circuit 235 (e.g., the activation sensor 120, the dispenser motor 200, the battery sensor 220, and the status light(s) 125). In the embodiment shown in FIG. 2, interface circuit 250 is connected and operative to receive an output from the activation sensor 120 in the form of a desired dispense signal, receive an output 225 from the battery sensor 220 in the form of a battery sensor output signal, and provide controller 240 with such received signals or other signals generated by interface circuit 250 in response to receiving such signals. Likewise, interface circuit 250 is operative to generate output signals, such a control signals or driving signals, in response to instructions or command signals received from the controller 240. For example, in the embodiment illustrated in FIG. 2, interface circuit 250 may generate a selective motor control signal 230 that is provided to motor 200 as an energizing control input for the motor 200 and may generate a power state indicator signal that is provided to status indicators 125 in response to instructions or command signals received from the controller 240 when transitioning to a different power state.

Those skilled in the art will appreciate that different embodiments of interface circuit 250 may include switches, relays, buffers, drivers, USART devices, general-purpose I/O pins, serial and/or parallel interface buses, and DMA circuitry (e.g., circuitry that helps facilitate quick storage of sample battery characteristic measurements, such as voltage measurements). Those skilled in the art will also appreciate that the particular elements that make up an exemplary interface circuit 250 will depend upon the complexity of the dispensing apparatus 100, such as the type of activation sensor 120 used in a particular dispensing application, the type of battery sensor 220 and battery characteristic monitored, the voltage level of the battery 205 used in the dispenser, the type and number of indicators 125 used, and the selective power circuitry used to selectively energize the motor 200 when providing the power connection between the battery 205 and the motor 200.

The embodiment illustrated in FIG. 2 shows the battery sensor 220 and the control circuitry 235 as separate circuits or devices. However, in another embodiment, the battery sensor 220 and the control circuitry 235 may be implemented as an integrated battery sensor circuit 255. In more detail, such an exemplary integrated battery sensor circuit 255 may implement both the battery sensor 220 and the control circuitry 235 using, for example, a microprocessor with onboard sensing circuits, a system-on-chip type of processing device having onboard interfacing circuitry, an application specific integrated circuit (ASIC), a programmable logic array that includes a voltage measuring interface circuit as well as logic devices (e.g., a field-programmable gate array (FPGA), programmable logic device (PLD)), or other hardwired logic with onboard voltage or current sensing circuits. Those skilled in the art will appreciate and understand how the integrated logic onboard such an exemplary integrated battery sensor circuit 250 may be specially-adapted to operate as a type of state machine, similar to the separate battery sensor 220 and control circuitry 235 as explained herein and in accordance with the exemplary methods of operation explained with reference to FIGS. 5A and 5B.

Those skilled in the art will also appreciate that in a further embodiment, an integrated battery sensor circuit may be implemented as a simpler dedicated circuit with a processing core, memory, and a battery sensor while other controller-like circuitry may be disposed within the dispenser to energize or otherwise control the dispensing motor, receive inputs from the activation sensor, and provide outputs to one or more status lights. As such, this embodiment of an integrated battery sensor circuit may be part of circuitry within the dispenser that manages and controls dispensing operations.

In a general embodiment, the dispensing state of the dispensing system may be an operational state related to the system or a power state related to the system. In more detail, an exemplary operational state may reflect a status of one or more parts of the system (e.g., parts other than the battery). For example, the operational state may include, but is not limited to, an inoperable state (such as a jammed, stalled, or broken state) and a normal operational state. An inoperable state is generally a situation where the dispensing system is unable to function as desired to dispense the product (such as when the system is out of products to dispense, is stalled, is jammed and cannot dispense products), whereas a normal operational state is generally a situation where the dispensing system is able to function and provide a desired dispense cycle operation when activated. In more detail, an exemplary jammed state may reflect a situation where a consumable product being dispensed is undesirably lodged in the dispenser, which causes the need for user intervention. An exemplary stalled state may reflect a situation where a consumable product being dispensed has started to be dispensed but completion of the dispense cycle is not possible due to circumstances other than a jam or lodged product. Those skilled in the art will appreciate that a jammed or stalled state (types of inoperable states) may be indicated by one or more unexpected variances in a monitored status of the battery relative to expected dispense cycle curves for that particular type of dispenser. As discussed in more detail below, an operational state may be indicated based upon a monitored status of the battery (e.g., one or more level characteristics of a dispense profile, such as a significant spike, dip, or other inflection in a measured battery voltage where no such significant changes was expected, and/or the timing characteristics (such as rise time or fall time) between such inflections). The operational state may be indicated based on monitored changes in such level and timing characteristics that are expected but not observed, as well as monitored changes in such level and/or timing characteristics that are not expected.

Figure 3:
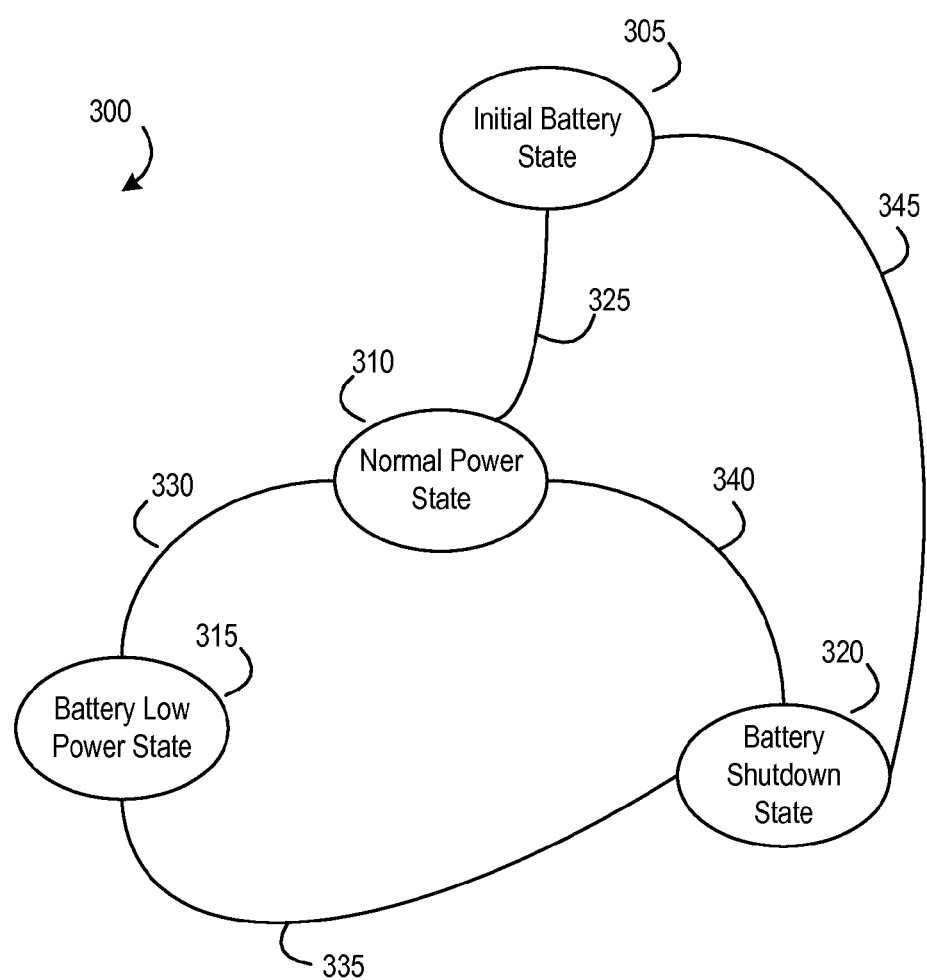
FIG. 3 is a state diagram of exemplary power states from an exemplary dispensing system in accordance with an embodiment of the invention.

In another embodiment, there are several different exemplary power states of a dispensing system that may be indicated by a monitored status of the battery in the system. FIG. 3 is a state diagram of exemplary power states from an exemplary dispensing system in accordance with an embodiment of the invention. Referring now to FIG. 3, four different exemplary power states are shown—an Initial Battery State 305, a Normal Power State 310, a Battery Low Power State 315, and a Battery Shutdown State 320. Transitions between the different power states will depend upon the monitored status of the battery in an embodiment. More specifically, depending on one or more samples of a measured battery characteristic (such as $V_{batt}$), an exemplary dispensing system may transition to increasingly lower power states until the system is in the Battery Shutdown State, where replacement of the battery is then warranted.

In a general embodiment, transitioning between battery states is related to comparing a monitored status to one or more boundaries. Such a boundary defines a limit related to when state transitions may occur relative to the monitored status (e.g., a measured battery characteristic, such as voltage or current supplied by the battery). Thus, a level of the monitored status may be considered to differ from a boundary when the measured or monitored status does not meet the boundary conditions (such as being above or below a threshold voltage level associated with that boundary, above or below a threshold current level associated with that boundary, or being outside an acceptable voltage or current range associated with that boundary). In other words, when a monitored status differs from a boundary, the measured or monitored status associated with one or more measured characteristic (e.g., battery voltage or battery current over time) may indicate the need to transition between states.

In more detail, exemplary battery states are described with reference to FIG. 3. The Initial Battery State 305 may generally be considered a power state of the battery upon power up of the dispensing system when the battery is in its fullest state. In one embodiment, an exemplary dispensing system may enter the Initial Battery State 305 when the battery 205 has been entirely replaced, or different cells that make up battery 205 have been replaced and the system was previously shutdown as a result. In another embodiment, an exemplary dispensing system may enter the Initial Battery State 305 when the system is otherwise new and powered up for the first time. As such, the dispensing system is deemed fully functional in the Initial Battery State 305 (also referred to as a Startup State).

In the Normal Power State 310, the dispenser system's battery may have a monitored status less than that of the Initial Power State 305, causing a transition 325 from state 305 to state 310, but the monitored status remains high enough to indicate the dispensing system can remain fully functional. In another embodiment, the transition 325 out of the Initial Battery State 305 and into the Normal Power State 310 may occur upon a first measurement of the dispenser system's battery 205 (rather than comparing and waiting to transition out of state 305 when a monitored status is found to be less than the first measured status).

While in the Normal Power State 310, when the dispenser system's battery 205 has a monitored status that falls below a "normal" threshold but is above a "shutdown" threshold, the power state transitions 330 from the Normal Power State 310 to the Battery Low Power State 315. If the dispenser system's battery 205 has a monitored status that falls below the "shutdown" threshold while in the Battery Low Power State 315, the power state transitions 335 from the Battery Low Power State 310 to the Battery Shutdown State 320. However, if the dispenser system's battery 205 has a monitored status that falls below the "shutdown" threshold while in the Normal Power State 310, the power state transitions 340 directly from the Normal Power State 310 to the Battery Shutdown State 320.

In an embodiment, one or more indicators, such as status indicators 125, may be activated upon transitioning to a particular power state to indicate the current power state of the improved dispensing apparatus 100 based upon the monitored status of the battery. In other words, with reference to the state diagram of FIG. 3, an embodiment may have the status indicators 125 collectively indicate which of power state (e.g., an Initial Battery State 305, a Normal Power State 310, a Battery Low Power State 315, and a Battery Shutdown State 320). For example, in a more detailed embodiment, control circuit 235 may have the interface circuit 250 generate a drive signal connected to status indicators 125 such that one of the lights is activated and illuminated upon transition 330 to indicate movement into the Battery Low Power State 315, while both of the status lights are activated and illuminated upon either transition 335 or 340 to indicate movement into the Battery Shutdown State 320.

Further embodiments may activate one or more status lights or indicators for all or selected ones of the power states. In still other embodiments, in addition to (or as an alternative) to activating lights or indicators, information about the battery state may be provided to an external interface (not shown in FIG. 2) that is coupled to interface circuit 250. For example, an exemplary external interface may be a data communication interface (e.g., network interface, serial communication interface, or the like) that allows for a remote device, such as a remote computer, to interact with dispenser apparatus 100. Such interactions may, for example, involve communications, messages, or signals indicative of the power state of the battery 205.

In a further embodiment, an initial level of a battery characteristic may be determined for relative battery level determinations. In a more detailed embodiment, such an initial level of a battery characteristic may be measured and stored when first arriving in the Initial Battery State 305 after battery replacement, and later used as part of establishing a relative battery level threshold value for determining whether the system can complete a dispense cycle operation (as opposed to using set threshold values). For example, a relative battery level threshold value may be 60% of the initial level of the battery characteristic (e.g., a voltage on the battery's output terminal when under the load of the motor during a startup phase). In this embodiment, the dispensing system may lose power when the battery is removed and measures and stored the initial level of the battery characteristic once power is reapplied to the system. In another embodiment, however, the dispensing system may have a hold-up circuit which keeps the onboard electronics of the dispensing system from losing power as the battery is removed and replaced. As such, the dispensing system may remain powered up and active, yet still may determine (e.g., measure and store) the initial level of the battery characteristics once the battery has been replaced.

Figure 4A:
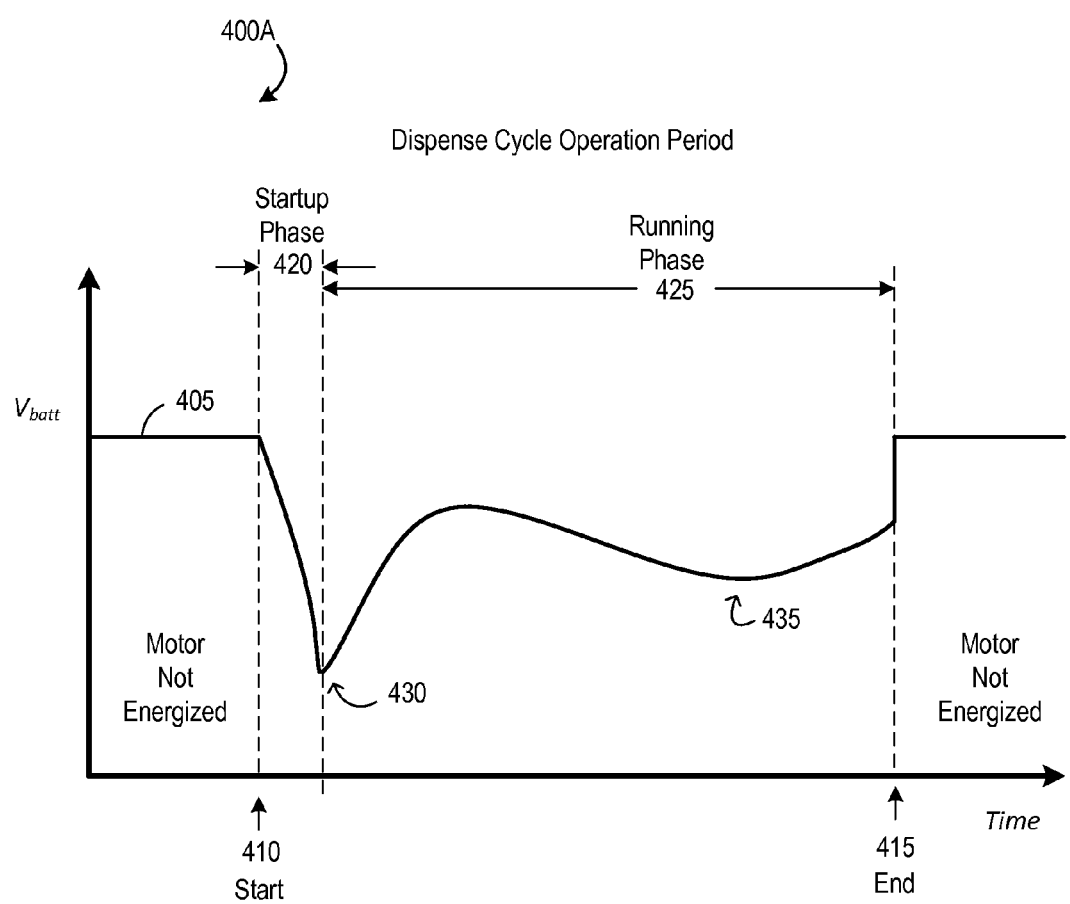
FIG. 4A is a graph illustrating an exemplary voltage characteristic of a battery over time during an exemplary dispense cycle operation in accordance with an embodiment of the invention.
Figure 4B:
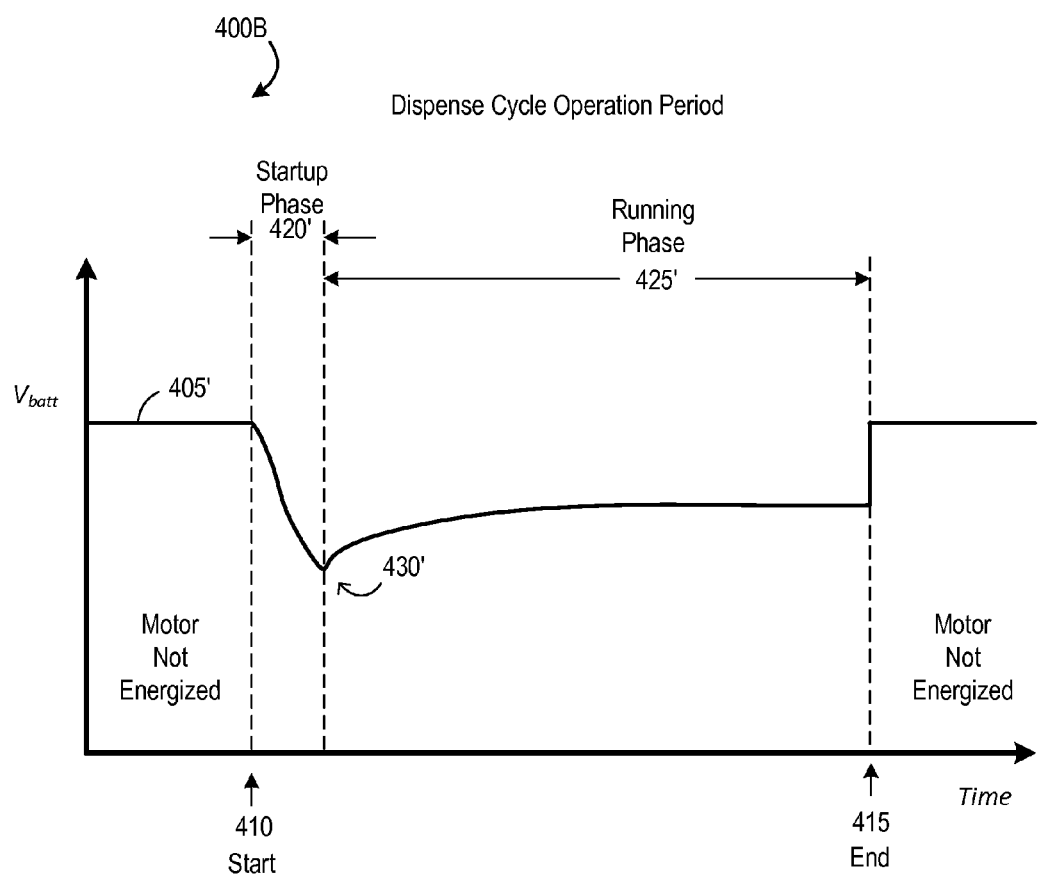
FIG. 4B is a graph illustrating another exemplary voltage characteristic of a of a battery over time during another exemplary dispense cycle operation in accordance with an embodiment of the invention.

FIGS. 4A-4D are graphs illustrating an exemplary voltage characteristic of a battery (also referred to as a battery voltage profile) over time during an exemplary dispense cycle operation with different types of dispensers in various operational states in accordance with various embodiments of the invention. In FIGS. 4A and 4B, the graphs illustrate an exemplary dispenser in an operational state capable of fully dispensing product. However, in FIGS. 4C and 4D, the graphs illustrate an exemplary dispenser in types of inoperable states and where an embodiment may further determine a type of inoperable state for the dispensing system based upon level and/or timing characteristics of the monitored battery voltage. Those skilled in the art will appreciate that different loads may be presented to motors deployed to dispense different types of products (e.g., a soap dispenser and a towel dispenser).

In more detail, FIG. 4A reflects an example where the dispense cycle operation relates to a soap dispense cycle, while FIG. 4B reflects an example where the dispense cycle operation relates to a towel dispense cycle. Referring now to graph 400A shown in FIG. 4A, over the course of this exemplary dispense cycle operation (e.g., a soap dispense cycle in the illustrated example), the voltage characteristic ($V_{batt}$) 405 of a dispensing system's battery, such as battery 205, varies depending on the condition of the battery and the time within the dispense cycle operation. In more detail, FIG. 4A illustrates the graph 400A having $V_{batt}$ on the y-axis and time on the x-axis. As depicted in FIG. 4A, the dispense cycle operation of the dispenser motor 200 has starting point 410 when the motor has been initially energized in a startup phase 420, and an ending point 415 after the motor has operated in a running phase 425 that occurs after the startup phase 420.

During the startup phase 420, the voltage characteristic ($V_{batt}$) 405 incurs a relatively significant drop due to a relatively high motor inrush current when the motor 200 has not yet substantially moved (e.g., prior to substantially any rotation of the motor's rotors or moving physical elements (such as plunger or piston) in response to being energized with electric power). At one point, the voltage characteristic ($V_{batt}$) 405 reaches a relative minimum 430 during this initial significant drop in the startup phase 420. The relative minimum 430 may be identified because the voltage characteristic that had been dropping in the startup phase 420 begins to level out and rise up at such a point. Such a relative minimum 430 (whether determined from raw measurements or a moving average of the raw measurements) corresponds to a peak load condition on the battery during the startup phase 420, and the voltage characteristic ($V_{batt}$) 405 measured at this relative minimum 430 reflects a peak load level for the battery characteristic. As shown in FIG. 4A, the startup phase 420 ends at this relative minimum 430. In other words, measurements of the voltage characteristic ($V_{batt}$) 405 continue as being within the startup phase 420 until the relative minimum 430 is identified, indicating an end to the startup phase 420.

As the motor 200 begins to turn and move (e.g., rotate its internal rotor or armature to spin its externally exposed axle), the dispense cycle operation of the motor 200 transitions and enters its running phase 425. When the motor 200 begins spinning, the motor 200 generates a back electromotive force (EMF—also known as a counter-electromotive force). This back EMF causes the voltage characteristic ($V_{batt}$) 405 to rise as the motor speed increases.

As $V_{batt}$ 405 rises upon entering the running phase 425, different types of dispensers may have a different shaped graph of $V_{batt}$ 405 corresponding to a different load profile during their running phase. In other words, the respective load presented to different types of motors may dynamically change over time or may settle into a more consistent or constant load during the running phase 425. For example, as shown in graph 400A of FIG. 4A where the motor 200 may be part of a soap dispenser pump, there may be a reduced load on the pump's motor before the motor engages the pump and begins compressing the pump (as shown in the beginning of running phase 425 in FIG. 4A). However, as the pump becomes compressed by motor 200, a second relative minimum 435 may be found that represents the peak load when the pump is fully compressed.

In another example, as shown in graph 400B of FIG. 4B where the motor 200 may be part of a towel dispenser, the load may be less dynamic and more constant during the running phase 425'. Thus, after moving through the startup phase 420' and reaching the relative minimum point 430', $V_{batt}$ 405' appears more smooth within this running phase 425' reflecting a more constant load on the towel dispenser's motor 200. Such different shaped running phase curves for different embodiments of dispensing systems and motors may be used to characterize the state of the battery. For example, a towel dispensing embodiment (such as that reflected in FIG. 4B) may have a relatively constant load during its running phase 425', such that an average of monitored or measured characteristics of the battery during the running phase 425' may be used to determine the current battery state in an embodiment.

Those skilled in the art will further appreciate that while different types of dispenser systems may have different types of expected battery voltage curves during a dispense cycle operation (such as curves 400A and 400B shown in FIGS. 4A and 4B, respectively), the expected curves for different dispenser systems of the same type (e.g., make/model but not necessarily the same product being dispensed) may be similar. In other words, an embodiment of the same type of towel dispensing system as used in the embodiment illustrated in FIG. 4B may have a similarly shaped running phase 425' that appears as relatively constant load during its running phase 425'. However, an embodiment of another type of towel dispensing system (not shown) may accelerate the drive roller at the beginning of the dispense cycle's running phase and later decelerate the drive roller towards the end of the running phase, which may result in a changing curve during the running phase (in contrast to the relatively flat curve shown in running phase 425').

Figure 4C:
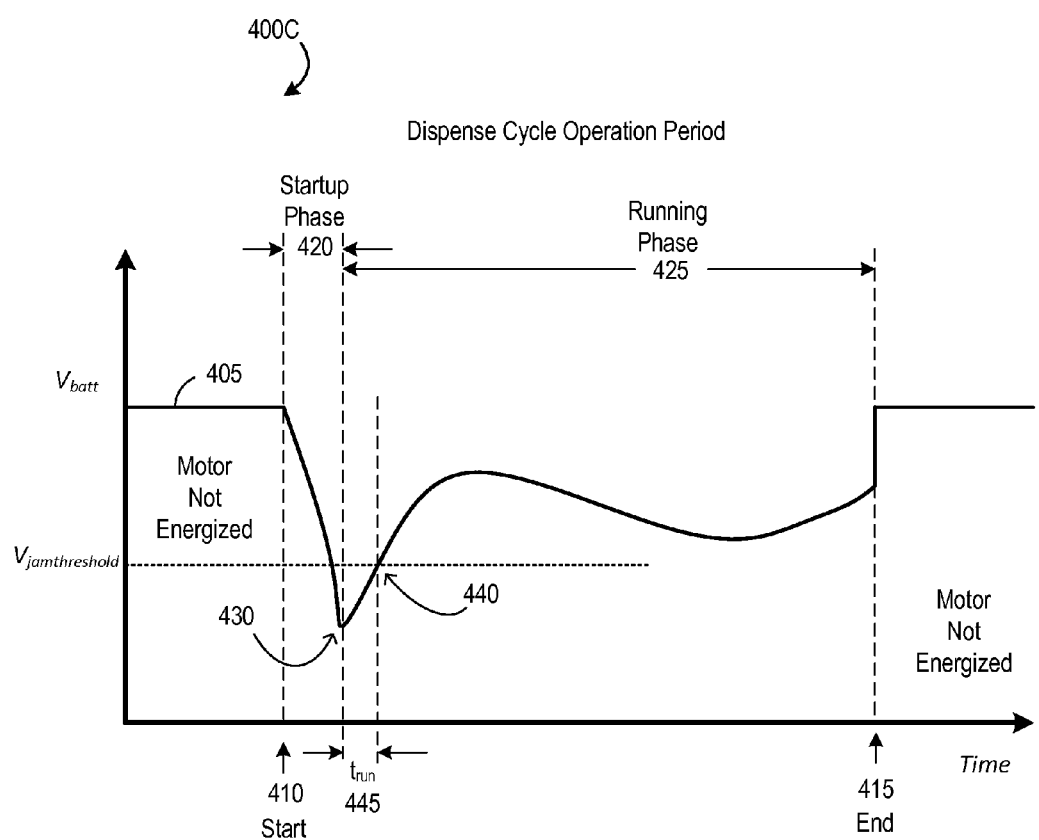
FIG. 4C is a graph illustrating still another exemplary voltage characteristic of a battery over time during an exemplary dispense cycle operation involving detecting of an exemplary jammed or stalled operational state in accordance with an embodiment of the invention.
Figure 5B:
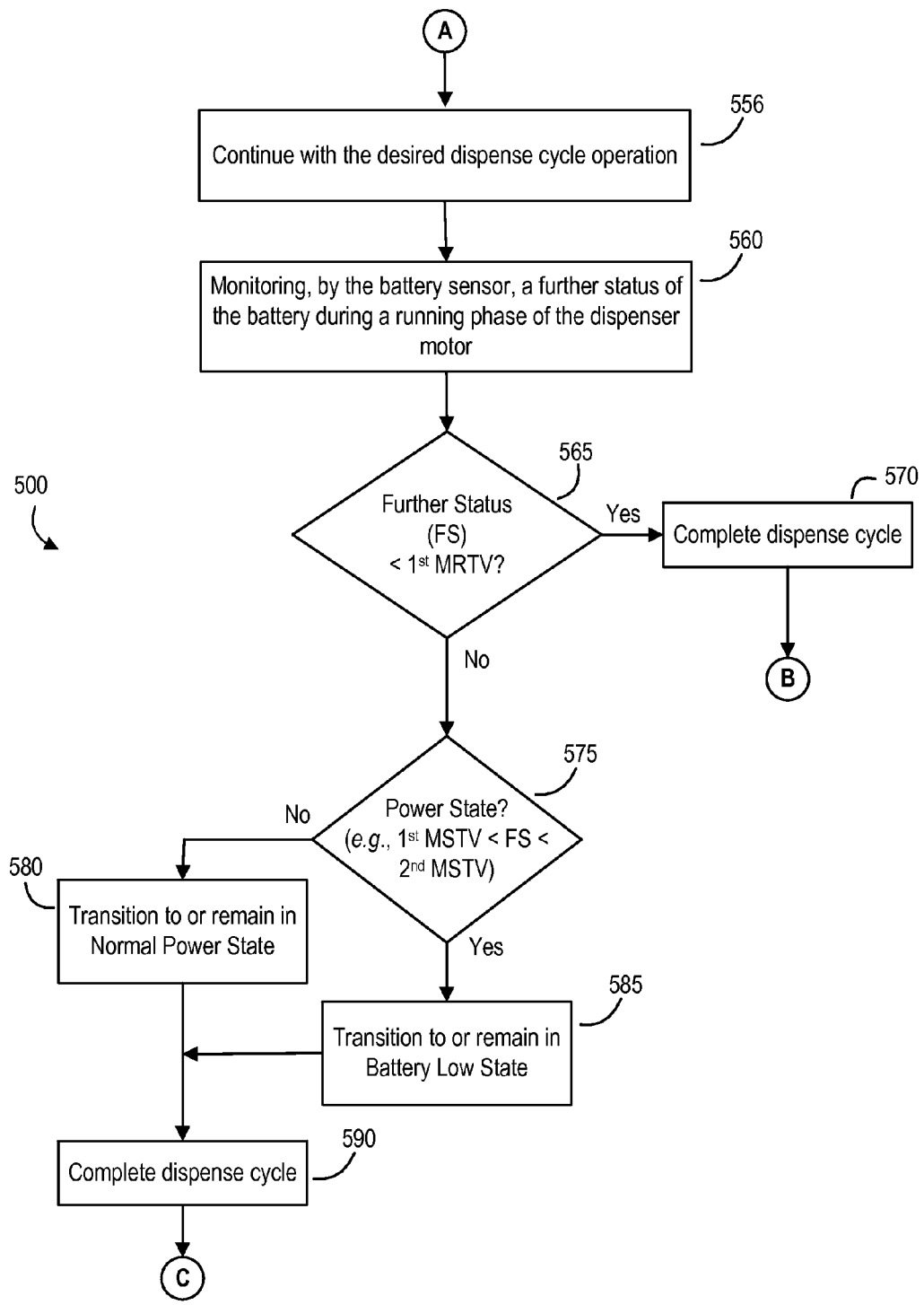

During operation of the motor 200, an embodiment may use a battery sensor and control circuit (such as battery sensor 220 and control circuit 235 or integrated battery sensor 255) to monitor the status of the battery 205 (e.g., via one or more measurements of the voltage characteristic ($V_{batt}$) 405) during the dispense cycle of the motor 200 in order to determine if the system can complete the desired dispense cycle operation of the dispensing system. FIGS. 4C and 4D illustrate exemplary graphs of monitored battery status (e.g., $V_{batt}$) during the dispenser cycle operation for an exemplary dispenser in types of inoperable states. As explained in more detail below, an embodiment may further determine a type of inoperable state for the dispensing system based upon level and/or timing characteristics of the monitored battery status.

Referring now to FIG. 4C, the measured and monitored $V_{batt}$ 405 characteristic shown in FIG. 4C is similar to that shown in FIG. 4A. However, as shown in FIG. 4C, an embodiment may observe the time ($t_{run}$ 445) it may take for the measured $V_{batt}$ 405 to rise from the relative minimum 430 to a battery voltage threshold level (shown as $V_{jamthreshold}$ in FIG. 4C). In general, the embodiment may detect a time for the monitored voltage status to reach a predetermined voltage threshold (e.g., $V_{jamthreshold}$) and then compare that detected time to other timing thresholds and/or signal characteristics as part of determining whether the system can complete the desired dispense cycle operation and identifying a type of problem with the dispensing system that corresponds to a particular type of inoperable state for the dispensing system.

For example, after detecting the rise time $t_{run}$ 445 from the relative minimum 430 to the threshold voltage $V_{jamthreshold}$, an embodiment may determine if the dispensing system is experiencing a jam or stall by considering the rise time against particular timing thresholds. In more detail, a further embodiment may identify the operational state of the dispenser as a normal state, a jammed state (such as a minor jam or a major jam), or a stalled state based at least in part on the detected rise time $t_{run}$ 445 from the relative minimum 430 to the threshold voltage $V_{jamthreshold}$. For example, the operational state of the dispenser may be considered to be a normal state when the rise time $t_{run}$ 445 is determined to be less than a minor jam timing threshold in this embodiment. As such, the monitored battery voltage is rising quickly enough to the threshold voltage $V_{jamthreshold}$ to indicate normal dispensing operation is possible and no need to abort. When the rise time $t_{run}$ 445 exceeds the minor jam timing threshold but is less than a major jam timing threshold in this embodiment, the dispenser may be considered to be in a minor jam state. In other words, the determined rise time $t_{run}$ 445 in this minor jam state is observed to be slower than expected (so that the dispenser is no longer in a normal operational state) but not so slow as to reflect a major jam or stall. In like manner, the dispenser may be considered to be in a major jam state when the rise time $t_{run}$ 445 exceeds the major jam timing threshold in this embodiment and the measured $V_{batt}$ 405 rises after the relative minimum 430 and continues rising as the measured $V_{batt}$ 405 reaches the threshold voltage $V_{jamthreshold}$. However, if the measured $V_{batt}$ 405 is not rising just after the relative minimum 430 (e.g., it begins to rise after the relative minimum 430 but never reaches the threshold voltage $V_{jamthreshold}$ level), the dispenser may be considered to be in a stalled state. In the stalled state, the dispensing motor 200 is not just slow but has reached a condition where it stalls after starting up becomes unable to successfully dispense product further from the dispensing system.

Another type of inoperable state of the dispensing system may be considered as a broken dispensing state. A broken dispensing state is a type of undesired inoperable state requiring more intensive user intervention (compared to a jammed or stalled state) and where the dispenser is not merely encumbered by product. For example, a broken dispensing state may be identified when the dispensing mechanism free spools after a breakage and the dispensing motor is no longer under an expected load.

FIG. 4D is a graph illustrating an exemplary voltage characteristic of a battery over time during an exemplary dispense cycle operation an exemplary inoperable state, such as a broken dispensing state, is detected. Referring now to FIG. 4D, the measured $V_{batt}$ 405 corresponding to the solid curved line in the graph 400D represents a normal dispense cycle operation (as explained with reference to FIG. 4A). Those skilled in the art will appreciate that operation of the dispensing system follows the illustrated solid curve 405 shown in graph 400D during normal operations until a breakage occurs, at which point the monitored battery voltage curve from that point forward will shift to the dashed curved line 465 if the cause of the breakage was not previous detected (and the dispense cycle aborted prior to breakage). For example, if a jam occurs during the running phase of the dispenser cycle operation, the jam may temporarily load the dispenser (such as shown as the dashed curved line 465 departing from line 405 as operation progresses up to time 455). The controller may detect the jammed state here due to the detected divergence of the measured $V_{batt}$ (i.e., what is shown in dashed lines for $V_{batt}$ 465 just prior to time 455 compared to what is shown in solid lines for $V_{batt}$ 405 just prior to time 455). In one embodiment, the jam may be detected such that the controller determined the system cannot compete the dispense cycle, and the controller aborts the dispense cycle then. However, in another embodiment where the jam is not detected quickly enough before time 455, the jam may cause the dispensing mechanism to quickly break and become unable to dispense any product. As a result of the break, the dispensing motor 200 becomes unloaded at time 455. From time 455 to time 460 as shown on graph 400D in FIG. 4D, the measured $V_{batt}$ 465 rises as the dispensing motor 200 free spins without dispensing any product. From time 460 to the end of the dispense cycle 415, the dispensing motor simply free spins at a steady state rate as energized and then measured $V_{batt}$ 465 returns to the non-energized motor level as shown after time 415 when the motor 200 is off. Thus, monitoring the status of the battery during the running phase may allow for determining if the dispensing system is in an inoperable state, such as a broken state, as shown in FIG. 4D by comparisons to expected curve values over time (should the cause of the broken state not be previously detected to avoid the broken state). In general, the measurements made by an exemplary battery sensor 220 may be used with or without averaging in either the startup phase or the running phase. Averaging, such as weighted or moving averaging, provides a type of smoothing to help identify trends in the battery status measurement and help avoid issues with random noise on such measurements. For example, in one embodiment, the measurements made by the battery sensor 220 may be averaged during the startup phase (such as when detecting a peak load level of the battery during the startup phase). Other embodiments may average the measurements made by the battery sensor 220 during the running phase (such as when detecting an unexpected diversion from an expected running phase curve indicating a broken inoperable state of the system). Still further embodiments may average the measurements made by the battery sensor 220 during both the startup phase and the running phase parts of the dispense cycle operation period. Such an averaged measurement may be accomplished with an averaging sensor or with multiple measurements by battery sensor 220 provided to controller 240, which then stores the measurements as data in memory 245 and determines the average as the monitored status of the battery.

In a more detailed example, the controller 240 may determine the averaged monitored status of the battery 205 using an average of the measurements of the battery characteristic during, for example, the startup phase 420 using a first weighted portion based on a rolling historic average of past measurements of the battery characteristic during the startup phase and a second weighted portion based on a present measurement of the battery characteristic provided to the controller on the battery sensor output signal. For example, the controller 240 may assign a 7/8 weight to the rolling historic average of past measurements while assigning a 1/8 weight to the present measurement. By relying upon different relative weights assigned to the present measurement and past averages of measurements, the overall process of monitoring a status of the dispensing system may be enhanced and improved because this averaging technique helps filter out single sampling errors from measured battery characteristics (e.g., voltage measurements) in phases of dispense cycle operations and helps avoid falsely aborting a dispense cycle operation.

In still another embodiment, the battery sensor 220 may operate to periodically sample the output of the battery 205 during both the startup phase 420 (or phase 420') and the running phase 425 (or phase 425') of the dispenser motor 200. In more detail and as reflected in the example of FIG. 4A, the dispenser motor 200 may provide a varying load against the output terminal 215 of the battery 205 during each of the startup phase 420 and the running phase 425 of the dispenser motor 200. As such, the controller 240 may be further adapted and operative to receive the samples as each sample is made during the startup phase 420 and the running phase 425, average the periodic samples over the startup phase 420 and the running phase 425, and then determine a power state of the system based upon the average of the periodic samples.

Determining whether the battery 205 can complete the desired dispense cycle operation based upon the monitored status of the battery indicative of a dispensing state of the dispensing system in an embodiment may be followed with further actions taken by the system as part of improved monitoring operations within the dispensing system. In one embodiment, the controller 240 (or integrated battery sensor 255) may selectively allow (e.g., initiate or abort) the desired dispense cycle operation depending upon at least one level of the monitored status. The monitored status may be indicative of a power state of the improved dispensing system (e.g., the state of the system's battery) or an operational state of the system (e.g., whether the system has dispensing mechanisms that are jammed).

In a more detailed embodiment, the controller 240 (or integrated battery sensor 255) may cause the desired dispense cycle operation to start when the power state is at least a normal power state (such as Normal Power State 310) or a battery low power state (such as Battery Low Power State 315), but abort the desired dispense cycle operation when the power state is a shutdown power state (such as Battery Shutdown State 320).

In another embodiment, the decision to abort may be made before the dispenser is put into an undesirable state, thus proactively preventing a jammed operational state, an undesired spillage situation, or some other state of the dispensing system that may require user intervention to correct. In a more detailed embodiment, the decision to abort in an embodiment may be made quickly before the dispensing system is able to meaningfully begin dispensing as operation just ends the startup phase. In some embodiments, the abort decision may take place right around the relative minimum 430 point. In more detail, the exemplary decision to abort may actually take effect as the dispenser barely enters the running phase after point 430 and as the motor has started to move but before the motor has appreciably moved. The goal is that the decision to abort may be made as quick as possible and timed to avoid significant entry into the running phase to help prevent some of the undesirable operational states and avoid finding the system in an inoperable state requiring more intensive user intervention.

As noted above, an embodiment may generally compare a monitored status to one or more boundaries when determining whether to transition to a different state. In a further detailed embodiment, the monitored status may be compared to two different thresholds—(1) a first motor startup threshold value (also referred to as a $1^{st}$ MSTV), and (2) a second motor startup threshold value (also referred to as a $2^{nd}$ MSTV). Such threshold values may correspond to voltage values when the monitored status is a measured battery voltage. In this embodiment, the first motor startup threshold value is lower than the second motor startup threshold value. As such, the controller 240 (or integrated battery sensor 255) may abort the desired dispense cycle operation by selectively deactivating a switch that energizes the dispenser motor 200, and generate a signal to cause the status light 125 to indicate a battery shutdown state (such as Battery Shutdown State 320) when the monitored status from the battery sensor during the startup phase is less than the first motor startup threshold value (e.g., a battery shutdown threshold voltage value for use when monitoring during the motor startup phase 420). However, when the level of the monitored status from the battery sensor 220 is less than the second motor startup threshold value and higher than the first motor startup threshold value, the dispenser motor 200 may still complete the desired dispense cycle operation.

Those skilled in the art will appreciate that the controller 240 may use information on the indicated state (based on the monitored status from the battery sensor 220 and various threshold values) as a basis for one or more appropriate actions. For example, the controller 240 may cause the status light 125 to indicate a battery low power state; transmit information on the indicated state through an external interface to a remote device outside of the dispenser; cause the dispenser to halt further dispensing operations; and/or store the indicated state in a data structure maintained in memory 245 for later use (e.g., to be downloaded during maintenance, etc.).

In a further embodiment, the battery sensor 220 may also operate to monitor a further status of the battery during the running phase 425 of the dispenser motor 200. When a level of the further status monitored by the battery sensor is less than a first motor running threshold value (also referred to as a $1^{st}$ MRTV), the dispenser motor 200 completes the desired dispense cycle operation and the controller 240 may take one or more appropriate actions as noted above (e.g., the status light 125 indicates a battery shutdown state of the improved dispensing system). However, when the level of the further status monitored by the battery sensor is less than a second motor running threshold value (also referred to as a $2^{nd}$ MRTV) but higher than the $1^{st}$ MRTV, the status indicator reflects a battery low power state of the dispensing system.

In light of the description of the above embodiments of an improved dispensing apparatus 100 and systems using elements from such an apparatus 100, a further description is provided on embodiments of methods of how they improve and enhance monitoring of a power state in a dispensing system. FIGS. 5A and 5B, collectively FIG. 5, are flow diagrams illustrating an example of an improved method for monitoring a power state of a dispensing system in accordance with an embodiment of the invention. In general, FIG. 5A involves monitoring the status of a dispensing system's battery during a startup phase, such as phase 420, of the system's dispensing motor, while FIG. 5B involves monitoring a further status during a running phase of the motor.

Referring now to FIG. 5A, method 500 begins at step 505 with an activation sensor (such as sensor 120) generating a signal indicative of a desired dispense cycle operation of the dispensing system in response to detecting user input by the activation sensor. Such user input may come in a variety of forms. For example, the user may place or otherwise move a hand in front of a motion-activated sensor that detects the user's movement. In another example, the user may remove an available product being dispensed from the system, and the activation sensor (e.g., a tear sensor) may generate the signal reflecting such user activity.

At step 510, method 500 proceeds to energize a dispenser motor in the system in response to the generated signal. In one embodiment, this may be accomplished with a control signal generated and sent by the system's control circuitry (such as controller 240 and interface circuit 250) to a control input of the dispensing motor, or to a control input of a switch that controls the power connection feed from the system's battery to the motor.

At step 515, method 500 employs a battery sensor (such as sensor 220) to monitor a status of the battery during a startup phase of the dispenser motor. In one embodiment, the monitoring step may comprise measuring a battery characteristic, such as battery voltage on an output terminal of the battery or current supplied by the battery, before the dispenser motor substantially moves in response to the energizing step 510. In more detail, such measuring may comprise measuring the battery characteristic to detect a peak load level of the battery characteristic before the dispenser motor substantially moves (i.e., during the startup phase) in response to the energizing step 510 (e.g., detecting $V_{batt}$ at point 430). In yet a further embodiment, such detecting may further comprise measuring a plurality of samples of the battery characteristic with the battery sensor during the startup phase to detect the peak load level of the battery characteristic, such as $V_{batt}$ at point 430 shown in the exemplary embodiment of FIG. 4A or point 430' shown in the exemplary embodiment of FIG. 4B.

Those skilled in the art will appreciate that detecting a peak load level of the battery characteristic may involve taking more than one measurement of the battery characteristic and comparing them. In a more detailed example, the controller may sample the battery characteristic (e.g., $V_{batt}$) after energizing the motor 200 and use a nominal amount of averaging to filter out anomalies due to noise. As such and during sampling, the controller may track the minimum filtered $V_{batt}$ value, which may correspond to relative minimum 430 on FIG. 4A and represent a peak load level on the battery.

In a further embodiment of method 500, step 515 may include measuring a plurality of samples of the battery characteristic with the battery sensor during the startup phase of the dispenser motor; and averaging the plurality of samples of the battery characteristic with the controller to determine the monitored status of the battery during the startup phase. Such averaging may be implemented in one embodiment by determining the average of the measured plurality of samples based on a first weighted portion based on a rolling historic average of past measurements of the battery characteristic and a second weighted portion based on a present measurement of the battery characteristic. This may provide an enhanced way to consider the importance of the most recent or present measurement relative to the rolling historic average of past measurement.

At step 520, method 500 determines, using a controller (such as controller 240 of control circuit 235 or integrated battery sensor 255), if the system can complete the desired dispense cycle operation based upon the monitored status of the battery indicative of a state of the dispensing system, such as a power state or an operational state. If so, step 520 moves to step 540. Otherwise, step 520 moves to step 525. At step 525, method 500 has the controller aborting the dispense cycle operation given the system's detected inability to complete the dispense cycle and proceeding to steps 530, 535, and 536 where the controller may take a responsive action depending on the error type related to why the system is unable to complete the dispense cycle. In particular, at step 530, the controller determines the type of error causing the dispensing system to be unable to complete the dispense cycle. If the determined error type is that the battery voltage is too low (e.g., $V_{batt} < 1^{st}$ MSTV), step 530 proceeds to step 535 where the method 500 has the controller transition to a battery shutdown power state. In some embodiments, step 535 may also change status indicators 125, such as one or more lights indicating or otherwise reflecting the battery shutdown power state. At this point, the batteries should be replaced in response to being in the battery shutdown power state before the dispensing system begins method 500 again.

However, if the determined error type is related to a jammed operational state or stalled operational state (such as that explained with reference to FIGS. 4C and 4D) based on characteristics of $V_{batt}$, step 530 proceeds to step 536 where method 500 has the controller change the status indicators 125 to reflect or otherwise indicate the relevant jammed or stalled state preventing a successful and complete dispense cycle. In a further embodiment of method 500, step 536 may wait for a user to clear the detected error (e.g., the jam or stall) and then proceed back to the start of method 500.

In a further embodiment of method 500, steps 520, 525, and 535 may be implemented with the controller aborting the desired dispense cycle operation and transitioning the power state to a battery shutdown state of the dispensing system if a level of the monitored status differs from a first motor startup boundary, such as when the level is less than a first motor startup threshold value. Measured battery voltage levels during the startup phase below that first motor startup threshold value indicate the battery is too low, and the system may be unable to successfully complete the desired dispense cycle operation, and the dispensing system needs a replacement battery before further system operations may take place.

At step 540, the controller may allow the desired dispense cycle operation to be completed as the power state is at least a normal power state or a battery low power state (e.g., when the controller determines the system can complete the desired dispense cycle operation based upon the monitored status of the battery). At step 545, the controller determines if the monitored status of the battery indicates the battery is in either the normal power state or the battery low power state by considering a second boundary condition. For example, if the monitored status of the battery is a battery voltage, an embodiment may have the controller compare the measured battery voltage from the battery sensor to a second boundary, such as $2^{nd}$ MSTV. In step 545, the measured battery voltage is already greater than the first motor startup threshold (e.g., a shutdown voltage level threshold for the startup phase as considered in an embodiment of step 520), and if the measured battery voltage is greater than the second motor startup threshold (e.g., a battery low voltage level threshold for the startup phase of motor 200), then step 545 moves to step 555 and the controller transitions to or remains in a normal power state. Otherwise, step 545 proceeds to step 550 where the controller transitions to or remains in a battery low state.

Method 500 has each of steps 550 and 555 then proceeds through (A) to step 556 in FIG. 5B, where the system continues with the desired dispense cycle operation by the dispenser motor. Referring now to FIG. 5B, method 500 has step 556 continuing with the desired dispense cycle operation even when the level of the monitored status is less than the second motor startup threshold value and the power state is a battery low power state. An embodiment of method 500 may also implement steps 550 and 555 by taking one or more appropriate actions, such as activating status lights that reflect the current power state in steps 550 and 555. For example, the controller may generate a drive signal (or cause a drive signal to be generated by interface circuitry) that is connected to the status lights, and that activate individual ones of the status lights so that the user or maintenance personnel is made aware of the power state of the system. In addition or alternatively, the controller may transmit information on the indicated state through an external interface to a remote device outside of the dispenser; cause the dispenser to halt further dispensing operations; and/or store the indicated state in a data structure maintained in memory 245 for later use (e.g., to be downloaded during maintenance, etc.).

At step 560, method 500 monitors a further status of the battery during a running phase of the dispenser motor. For example, such a further status may be one or more battery voltage measurements at different points in time or a select point in time (such as the second relative minimum point 435) during the running phase 425 of the dispense cycle.

At step 565, if a level of the further status differs from a first motor running boundary, such as when the level is less than a first motor running threshold value, then the system completes the desired dispense cycle operation by the dispenser motor at step 570 and method 500 moves back to step 535 in FIG. 5A through (B) where the controller transitions the power state to a battery shutdown state of the dispensing system. Otherwise, step 565 proceeds to step 575.

At step 575, the controller determines if the monitored further status of the battery indicates the battery is in either the normal power state or the battery low power state. For example, if the monitored further status of the battery is a battery voltage during the running phase, an embodiment may have the controller compare the measured battery voltage from the battery sensor during the running phase to a second motor running threshold. In step 575, if the measured battery voltage from the battery sensor during the running phase (i.e., a type of further status monitored during the running phase in an embodiment of step 560) differs from a second motor running boundary, such as when the voltage level is greater than the second motor startup threshold (e.g., a battery low voltage level threshold for the running phase of motor 200), then step 575 moves to step 580 and the controller transitions to or remains in a normal power state. Otherwise, step 575 proceeds to step 585 where the controller remains or transitions to a battery low state. Thereafter, step 590 has the system completing the desired dispense cycle operation by the dispenser motor, and proceeding back to FIG. 5A through (C).

Thus, an embodiment of method 500 (collectively on FIGS. 5A and 5B) may involve periodically sampling, by the battery sensor 220, during both the startup phase 420 and the running phase 425 of the dispenser motor 200, wherein each of these phases of the dispenser motor has the motor providing a load against the battery and draws energy from the battery. And as such, the controller may average the periodic samples and determine a power state of the dispensing system based upon the average of the periodic samples that cover both the startup and running phases of the dispensing motor.

Further embodiments may be used to monitor a status of other parts of the dispenser system (other than the battery) based upon measurements of a battery characteristic. In a general embodiment, one or more characteristics of the dispense cycle curves (such as those shown in graphs 400A-400D of FIGS. 4A-4D, respectively) may be monitored, detected, measured, or sensed over the dispense cycle operation period (or parts thereof) and used to inform the system of the operational state of different dispenser mechanisms, such as the motor. An exemplary dispensing system in such a further embodiment may operate as described above with the components of FIG. 2 and with respect to steps 505-515 of method 500, but rather than determining whether the system can complete the desired dispense cycle operation, this further embodiment may involve having the controller determine a dispensing state of the system based on monitoring or measuring the status of the battery for one or more unexpected characteristics of a dispense profile (such as a significant spike, dip, or other inflection in a measured battery voltage where no such significant changes were expected). As explained above with reference to FIGS. 4C and 4D, such a monitored or detected unexpected characteristic (e.g., a comparison of the voltage level to an expected voltage level, a comparison of a detected rise time compared to various time thresholds, monitoring whether the voltage level is rising or not) may be used to declare a jam or motor stall operational state, or allow for the controller to selectively opt not to initiate or continue with a dispense cycle operation (or commence a further dispense cycle operation) given the characteristics monitored indicate an impending undesirable state (e.g., the beginnings of a malfunctioning pump or other dispensing mechanism as reflected by unexpected forms of the dispense cycle curve or other spikes or dips in the monitored status as shown in the examples illustrated in FIGS. 4C and 4D). Additionally, the controller may cause the status indicators to reflect such an operational state so that a user may better know the operational status of the dispensing system or may transmit information related to the operational state outside of the dispenser.

Those skilled in the art will appreciate that aspects of method 500 as disclosed and explained above in various embodiments may be implemented on a controller, such as controller 240 or as part of an integrated battery sensor 255 illustrated in FIG. 2. If such a controller is implemented with a programmable microcontroller or microprocessor, specific non-transient program code may be stored in memory 245 in addition to other data (such as measurements from the battery sensor 205). Such exemplary non-transient program code may be stored on a non-transitory computer-readable medium such as memory storage 245 and operates, when executed by the programmable processing unit (e.g., microcontroller, microprocessor), to specially adapt the functions of the controller beyond that of a generic computer. In other words, when executing such non-transient code, the controller may be operative to perform operations or steps from aspects of the exemplary methods disclosed above, including method 500 and described variations of that method. In summary, it should be emphasized that the sequence of operations to perform any of the methods and variations of the methods described in the embodiments herein are merely exemplary, and that a variety of sequences of operations may be followed while still being true and in accordance with the principles of the present invention.

Those skilled in the art will appreciate that embodiments may provide one or more advantages, and not all embodiments necessarily provide all or more than one particular advantage as set forth here. Additionally, it will be apparent to those skilled in the art that various modifications and variations can be made to the structures and methodologies described herein. Thus, it should be understood that the invention is not limited to the subject matter discussed in the description. Rather, the present invention, as recited in the claims below, is intended to cover modifications and variations.

What is claimed:

1. An improved method for monitoring a dispensing state of a dispensing system, the dispensing system having at least an activation sensor, a controller, a dispenser motor, a battery, and a battery sensor, the improved method comprising the steps of:
   generating a signal by the activation sensor of the dispensing system, the signal indicative of a desired dispense cycle operation of the dispensing system;
   energizing the dispenser motor in response to the generated signal;
   monitoring, by the battery sensor, a status of the battery during at least a startup phase of the dispenser motor;
   determining, by the controller, if the system can complete the desired dispense cycle operation based upon the monitored status of the battery indicative of the dispensing state of the dispensing system, wherein the dispensing state comprises a power state;
   aborting, by the controller, the desired dispense cycle operation and transitioning the power state to a battery shutdown state of the dispensing system if a level of the monitored status differs from a first motor startup boundary; and
   completing the desired dispense cycle operation by the dispenser motor and transitioning the power state to a battery low power state of the dispensing system if the level of the monitored status differs from a second motor startup boundary.

2. The improved method of claim 1, wherein the dispensing state comprises an operational state.

3. The improved method of claim 2, wherein the operational state comprises at least one from the group consisting of a jammed state, a stalled state, an inoperable state, and a normal operational state.

4. The improved method of claim 1 further comprising completing, by the controller, the desired dispense cycle operation if the power state is sufficient to complete a dispense operation cycle.

5. The improved method of claim 1 further comprising completing, by the controller, the desired dispense cycle operation if the power state is at least a normal power state or a battery low power state.

6. The improved method of claim 1 further comprising aborting, by the controller, the desired dispense cycle operation if the power state of the dispensing system is a shutdown power state.

7. The improved method of claim 1 further comprising aborting, by the controller, the desired dispense cycle operation based upon at least one level of the monitored status.

8. The improved method of claim 1 further comprising selectively allowing, by the controller, the desired dispense cycle operation to continue based upon one or more characteristics of the monitored status before the dispensing system enters an inoperable state.

9. The improved method of claim 1, wherein the monitoring step further comprises measuring a battery characteristic before the dispenser motor substantially moves in response to the energizing step.

10. The improved method of claim 9, wherein the measuring step further comprises measuring the battery characteristic to detect a peak load level of the battery characteristic before the dispenser motor substantially moves in response to the energizing step.

11. The improved method of claim 10, wherein the detecting step further comprises measuring a plurality of samples of the battery characteristic with the battery sensor during the startup phase to detect the peak load level of the battery characteristic.

12. The improved method of claim 1, wherein the monitoring step further comprises:
   measuring a plurality of samples of the battery characteristic with the battery sensor during the startup phase of the dispenser motor; and
   averaging the plurality of samples of the battery characteristic to determine the monitored status of the battery during the startup phase.

13. The improved method of claim 12, wherein the averaging step further comprises determining the average of the measured plurality of samples based on a first weighted portion based on a rolling historic average of past measurements of the battery characteristic and a second weighted portion based on a present measurement of the battery characteristic.

14. The improved method of claim 1, wherein the monitoring step further comprises:
periodically sampling, by the battery sensor, during the startup phase and a running phase of the dispenser motor, wherein each of the startup phase and the running phase of the dispenser motor has the motor providing a load against the battery and drawing energy from the battery; and
further comprising averaging, by the dispenser controller, the periodic samples to determine the power state of the dispensing system based upon the average of the periodic samples.

15. The improved method of claim 1 further comprising:
measuring, with the battery sensor, an initial level of a battery characteristic for the battery currently used in the dispensing system;
wherein the determining step further comprises
comparing, by the dispenser controller, (a) the monitored status of the battery measured by the battery sensor with (b) a relative battery status threshold value, the relative battery status threshold value being based upon the initial level of the battery characteristic; and
determining, by the dispenser controller, if the system can complete the desired dispense cycle operation of the dispensing system based upon the comparison of the monitored status of the battery and the relative battery status threshold value.

16. An improved method for monitoring a dispensing state of a dispensing system, the dispensing system having at least an activation sensor, a controller, a dispenser motor, a battery, and a battery sensor, the improved method comprising the steps of:
generating a signal by the activation sensor of the dispensing system, the signal indicative of a desired dispense cycle operation of the dispensing system;
energizing the dispenser motor in response to the generated signal;
monitoring, by the battery sensor, a status of the battery during at least a startup phase of the dispenser motor;
determining, by the controller, if the system can complete the desired dispense cycle operation based upon the monitored status of the battery indicative of the dispensing state of the dispensing system;
completing, by the controller, the desired dispense cycle operation if the power state is sufficient to complete a dispense operation cycle;
monitoring, by the battery sensor, a further status of the battery during a running phase of the dispenser motor;
if a level of the further status differs from a first motor running boundary, then completing the desired dispense cycle operation by the dispenser motor and transitioning the power state to a battery shutdown state of the dispensing system; and
transitioning the power state to a battery low power state of the dispensing system if the level of the further status differs from a second motor running boundary.

17. An improved dispensing system, comprising:
a battery having an output for providing power for the system;
a dispenser motor selectively coupled to the battery, the dispenser motor being responsive when energized to facilitate dispensing a consumable product in a desired dispense cycle operation;
a battery sensor having an input coupled to the output of the battery, the battery sensor operating to monitor a status of the battery during a startup phase of the energized dispenser motor and provide the monitored status as a battery sensor output signal;
control circuitry comprising at least a controller that is operative to
selectively couple the dispenser motor and the battery to energize the dispenser motor,
receive the battery sensor output signal associated with the monitored status of the battery from the battery sensor during the startup phase of the dispenser motor, and
determine if the system can complete the desired dispense cycle operation of the dispensing system based upon the monitored status of the battery during the startup phase of the dispenser motor indicative of a dispensing state of the system; and
a status indicator coupled to the control circuitry, the status indicator reflecting a power state of the improved dispensing system based upon the monitored status of the battery;
wherein the controller aborts the desired dispense cycle operation by selectively deactivating the switch that energizes the dispenser motor and the status indicator reflects a battery shutdown state of the improved dispensing system when the monitored status from the battery sensor during the startup phase differs from a first motor startup boundary; and
wherein the dispenser motor completes the desired dispense cycle operation and the status indicator reflects a battery low power state of the improved dispensing system when the level of the monitored status from the battery sensor differs from a second motor startup boundary.

18. The improved dispensing system of claim 17, wherein the dispensing state comprises at least one of a power state and an operational state.

19. The improved dispensing system of claim 18, wherein the operational state comprises at least one from the group consisting of a jammed state, a stalled state, an inoperable state, and a normal operational state.

20. The improved dispensing system of claim 17 further comprising an activation sensor that generates a signal indicative of the desired dispense cycle operation; and
wherein the controller is further operative to detect the generated signal from the activation sensor, and selectively couple the dispenser motor and the battery in response to the detected signal from the activation sensor.

21. The improved dispensing system of claim 17, wherein the status indicator comprises a plurality of lights that collectively indicate a type of power state or a type of operation state.

22. The improved dispensing system of claim 17, wherein the battery sensor measures a battery characteristic on the output of the battery before the dispenser motor substantially moves during the startup phase after being selectively energized at a beginning of the desired dispense cycle operation, wherein the battery sensor provides the measured battery characteristic as the battery sensor output signal.

23. The improved dispensing system of claim 22, wherein the controller averages the measurements of the battery characteristic during the startup phase as an averaged monitored status of the battery.

24. The improved dispensing system of claim 23, wherein the controller determines the averaged monitored status of the battery using an average of the measurements of the battery characteristic during the startup phase based on a first weighted portion based on a rolling historic average of past measurements of the battery characteristic during the startup phase and a second weighted portion based on a present measurement of the battery characteristic provided to the controller on the battery sensor output signal.

25. The improved dispensing system of claim 22, wherein the battery sensor detects a peak load level of the battery characteristic before the dispenser motor substantially moves and during the startup phase, wherein the battery sensor provides the detected peak load level of the battery characteristic as the battery sensor output signal.

26. The improved dispensing system of claim 17, wherein the controller is further operative to selectively initiate the desired dispense cycle operation based upon the dispensing state.

27. The improved dispensing system of claim 26, wherein the controller is further operative to selective initiate the desired dispense cycle operation based upon one or more characteristics of the monitored status before the dispensing state of the improved dispensing system enters an undesirable state.

28. The improved dispensing system of claim 17, wherein the dispensing state of the system is a power state related to the monitored status of the battery provided by the battery sensor output signal; and
    wherein the controller is further operative to
        initiate the desired dispense cycle operation when the power state is at least a normal power state or a battery low power state, and
        abort the desired dispense cycle operation when the power state is a battery shutdown state.

29. The improved dispensing system of claim 17, wherein the battery sensor operates to periodically sample the output of the battery during the startup phase and a running phase of the dispenser motor, wherein the dispenser motor provides a varying load against the output of the battery during each of the startup phase and the running phase of the dispenser motor; and
    wherein the controller is further operative to
        receive the battery sensor output as each of the periodic samples during the startup phase and the running phase,
        average the periodic samples over the startup phase and the running phase, and
        determine a power state of the system based upon the average of the periodic samples.

30. The improved dispensing system of claim 17, wherein the battery sensor further operates to measure an initial level of a battery characteristic on the output of the battery in the dispensing system, and provide the initial level of the battery characteristic to the controller; and
    wherein the controller is operative to determine if the system can complete the desired dispense cycle operation of the dispensing system by being further operative to:
        receive the initial level of the battery characteristic from the battery sensor,
        compare (a) the monitored status of the battery measured by the battery sensor during the startup phase with (b) a relative battery status threshold value, the relative battery status threshold value being based upon the initial level of the battery characteristic, and
        determine, by the dispenser controller, if the system can complete the desired dispense cycle operation based upon the comparison of the monitored status of the battery and the relative battery status threshold value.

31. An improved dispensing system, comprising:
    a battery having an output for providing power for the system;
    a dispenser motor selectively coupled to the battery, the dispenser motor being responsive when energized to facilitate dispensing a consumable product in a desired dispense cycle operation;
    a battery sensor having an input coupled to the output of the battery, the battery sensor operating to monitor a status of the battery during a startup phase of the energized dispenser motor and provide the monitored status as a battery sensor output signal, wherein the battery sensor additionally operates to monitor a further status of the battery during a running phase of the dispenser motor;
    a status indicator coupled to the control circuitry, the status indicator reflecting a power state of the improved dispensing system based upon the monitored status of the battery;
    control circuitry comprising at least a controller that is operative to
        selectively couple the dispenser motor and the battery to energize the dispenser motor,
        receive the battery sensor output signal associated with the monitored status of the battery from the battery sensor during the startup phase of the dispenser motor, and
        determine if the system can complete the desired dispense cycle operation of the dispensing system based upon the monitored status of the battery during the startup phase of the dispenser motor indicative of a dispensing state of the system; and
    wherein the dispenser motor completes the desired dispense cycle operation and the status indicator reflects a battery shutdown state of the improved dispensing system when a level of the further status monitored by the battery sensor differs from a first motor running boundary; and
    wherein the status indicator reflects a battery low power state of the dispensing system when the level of the further status monitored by the battery sensor differs from a second motor running boundary.

32. An improved dispensing apparatus, comprising:
    a dispenser housing for containing a dispensable consumable product;
    a battery disposed within the dispenser housing, the battery having at least one output terminal for providing power for the apparatus;
    a dispenser motor disposed within the dispenser housing and selectively connected to the at least one output terminal of the battery, the dispenser motor being responsive when energized by a power connection to the battery through the output terminal to facilitate dispensing the dispensable consumable product, the dispenser motor having a startup phase when initially energized and a running phase while the dispenser motor remains energized after the startup phase;
    a battery sensor disposed within the dispenser housing, the battery sensor having an input connected to the at least one output terminal of the battery, the battery sensor measuring a battery characteristic on the at least one output terminal of the battery before the dispenser motor substantially moves during a startup phase of the dispenser motor and providing the measured battery characteristic as a battery sensor output signal;

at least one status indicator disposed as part of the dispenser housing, wherein the status indicator providing user feedback related to a dispensing status of the system;

an activation sensor that generates a signal indicative of a desired dispense cycle operation in response to detecting user activity; and control circuitry comprising at least a controller, a memory coupled to the controller, and an interface circuit coupled to the controller, the activation sensor, the dispenser motor, the battery sensor, and the status indicator, wherein the controller is programmatically adapted by executable code maintained on the memory to be operative to:

detect the signal from the activation sensor through the interface circuit, selectively activate the power connection between the dispenser motor and the at least one output terminal of the battery in response to the detected signal from the activation sensor, during the startup phase of the dispenser motor, receive the battery sensor output signal through the interface circuit, when the level of the measured battery characteristic from the battery sensor during the startup phase differs from a first motor startup boundary, deactivate the power connection between the dispenser motor and the at least one terminal of the battery to abort the desired dispense cycle operation and cause the status indicator to reflect a battery shutdown state of the improved dispensing apparatus, and when the level of the measured battery characteristic from the battery sensor during the startup phase differs from a second motor startup boundary, continue to activate the power connection while the dispenser motor completes the desired dispense cycle operation and cause the status indicator to reflect a battery low power state of the improved dispensing apparatus.

33. The improved dispensing apparatus of claim 32, wherein the battery sensor measures the battery characteristic to detect a peak load level of the battery characteristic before the dispenser motor substantially moves and during the startup phase, wherein the battery sensor provides the detected peak load level of the battery characteristic as the battery sensor output signal.

* * * * *